(12) United States Patent
Sameshima

(10) Patent No.: US 8,171,792 B2
(45) Date of Patent: May 8, 2012

(54) INERTIA SENSOR AND INERTIA DETECTOR DEVICE

(75) Inventor: Toshihisa Sameshima, Kagoshima (JP)

(73) Assignee: Sony Corporation, Tokyo (JP)

( * ) Notice: Subject to any disclaimer, the term of this patent is extended or adjusted under 35 U.S.C. 154(b) by 707 days.

(21) Appl. No.: 12/270,961

(22) Filed: Nov. 14, 2008

(65) Prior Publication Data

US 2009/0126490 A1 May 21, 2009

(30) Foreign Application Priority Data

Nov. 21, 2007 (JP) ................................. 2007-302297

(51) Int. Cl.
*G01C 19/56* (2012.01)
(52) U.S. Cl. .................................. 73/504.04; 73/504.12
(58) Field of Classification Search ................ 73/504.04, 73/504.12, 504.14, 514.32
See application file for complete search history.

(56) References Cited

U.S. PATENT DOCUMENTS

2007/0180909 A1* 8/2007 Uchiyama et al. ......... 73/504.14

FOREIGN PATENT DOCUMENTS

| JP | 08-068636 | 3/1996 |
|---|---|---|
| JP | 08-094661 | 4/1996 |
| JP | 09-318649 | 12/1997 |
| JP | 10-239196 | 9/1998 |
| JP | 2002-131331 | 5/2002 |
| JP | 2007-071677 | 3/2007 |
| JP | 2007-248453 | 9/2007 |
| JP | 2007-333643 | 12/2007 |

* cited by examiner

*Primary Examiner* — John Chapman, Jr.
(74) *Attorney, Agent, or Firm* — SNR Denton US LLP

(57) ABSTRACT

A detector device includes a drive circuit for outputting a drive pulse signal for displacing the variable block, a detection pulse signal applying unit by which the variable capacitance elements and the fixed capacitance element whose one end is connected in common are respectively applied, at their other ends, with detection pulse signals with a plurality of phases each having a predetermined phase difference at a timing synchronized with the drive pulse signal, and an inertia detection unit for detecting a difference in capacitance value between the variable capacitance elements to which the detection pulse signal having the phase difference is applied, or between the fixed capacitance element and the variable capacitance element, and detecting the applied inertial force based on the difference.

10 Claims, 14 Drawing Sheets

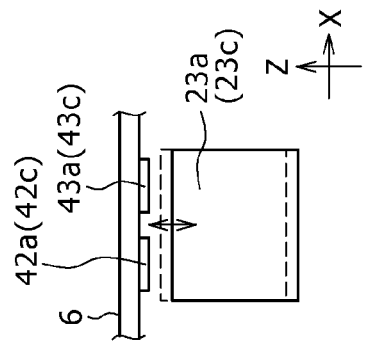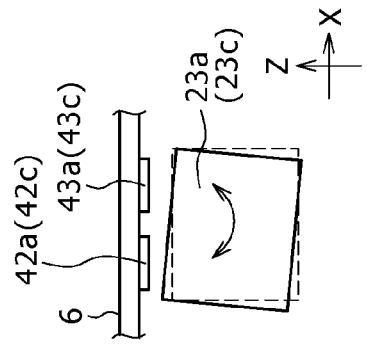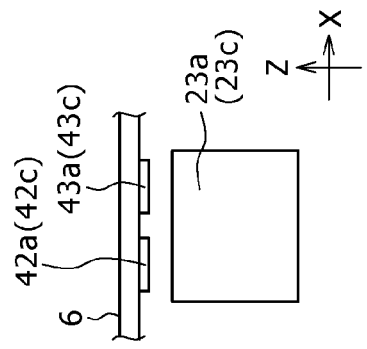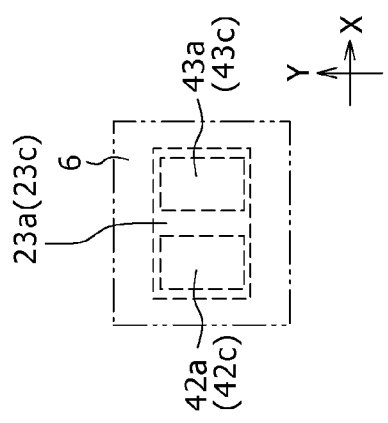

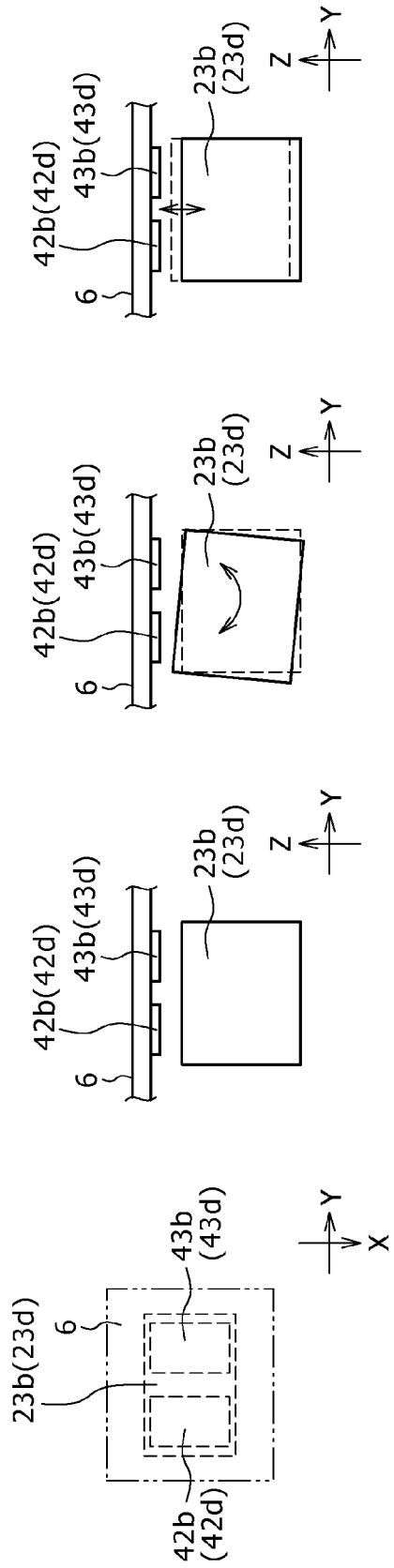

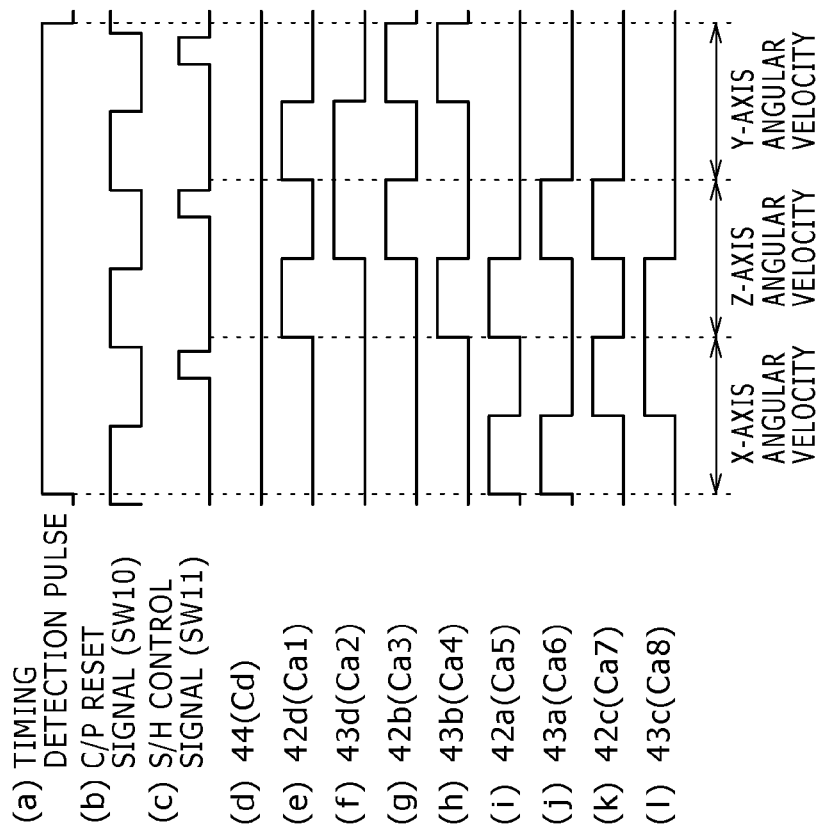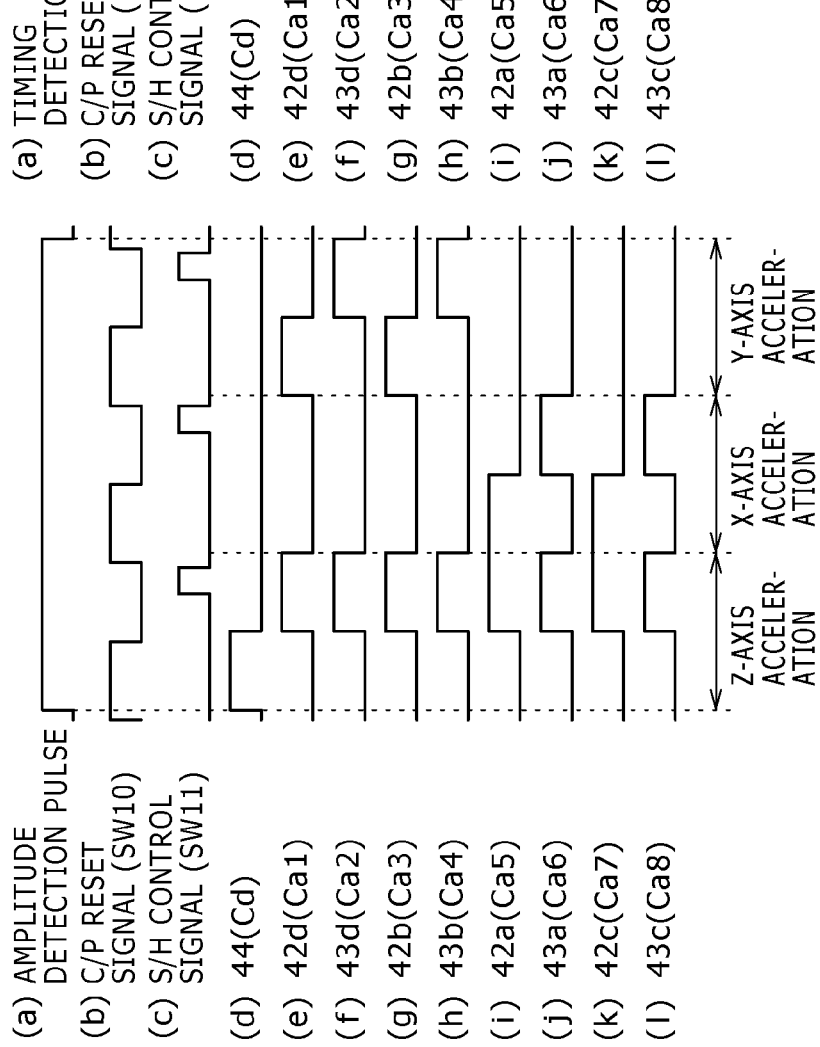

(a) TIMING DETECTION PULSE
(b) C/P RESET SIGNAL (SW10)
(c) S/H CONTROL SIGNAL (SW11)
(d) 44(Cd)
(e) 42d(Ca1)
(f) 43d(Ca2)
(g) 42b(Ca3)
(h) 43b(Ca4)
(i) 42a(Ca5)
(j) 43a(Ca6)
(k) 42c(Ca7)
(l) 43c(Ca8)

Z-AXIS ACCELERATION | X-AXIS ACCELERATION | X-AXIS ANGULAR VELOCITY | Z-AXIS ANGULAR VELOCITY | Y-AXIS ANGULAR VELOCITY | Y-AXIS ACCELERATION (a) DRIVE PULSE SIGNAL
(b) DISPLACEMENT
(c) CORIOLIS FORCE
(d) MONITOR PERIOD
(e) DISPLACEMENT DETECTING PULSE SIGNAL

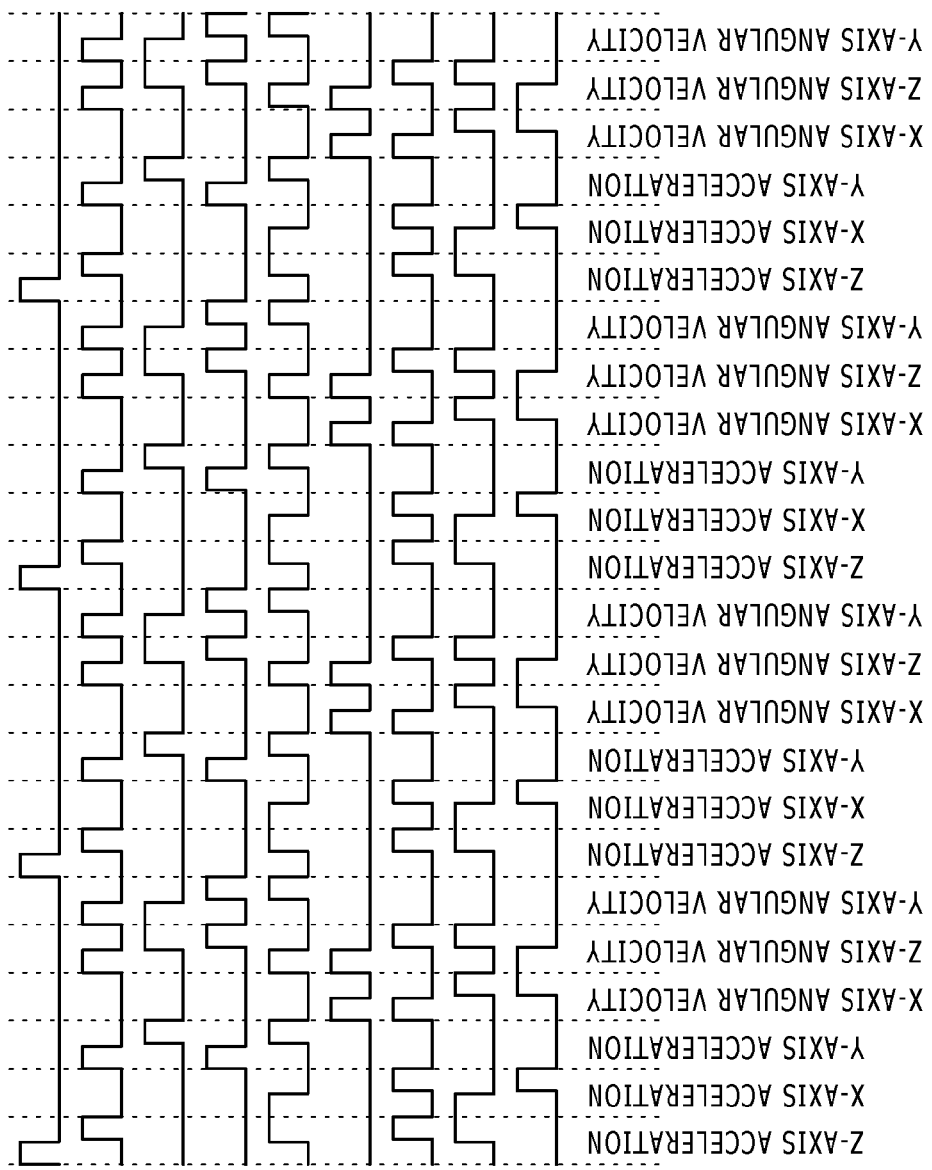

1

INERTIA SENSOR AND INERTIA DETECTOR DEVICE

CROSS-REFERENCES TO RELATED APPLICATIONS

The present document contains subject matter related to Japanese Patent Application No. 2007-302297 filed in the Japanese Patent Office on Nov. 21, 2007, the entire content of which being incorporated herein by reference.

BACKGROUND OF THE INVENTION

1. Field of the Invention

The present invention relates to an inertia sensor for detecting an angular velocity and acceleration, and a detector device thereof.

2. Description of the Related Art

An inertia sensor has been known that is attached to an object and can detect acceleration and an angular velocity which are produced when the object carries out acceleration movement and angular velocity movement.

This inertia sensor detects individual acceleration per each axial direction at X-axis, Y-axis, or Z-axis defined as the 3-dimensional space, and detects individually the angular velocity per each axis which serves as rotation axis, whereby the acceleration and the angular velocities of the object moving in the 3-dimensional space has been detected.

In recent years, as an inertia sensor which can detect acceleration and an angular velocity of an object simultaneously, a sensor is proposed using a structural body having a movable body (oscillator) which is displaced in accordance with acceleration movement and angular velocity movement of an object.

As for this inertia sensor, in the case where the X-axis, the Y-axis, and the Z-axis which intersect orthogonally to one another are defined in the 3-dimensional space, in a situation where the movable body is vibrated at predetermined time cycle in the Z-axis direction, and when the object carries out angular velocity movement by assuming the X-axis or the Y-axis as a rotation axis, then Coriolis force acting in a direction orthogonal to a movement direction of the object is detected to find the angular velocity assuming the Y-axis or the X-axis as a central axis and the angular velocity in the X-axis direction, or the Y-axis direction (see Japanese Patent No. 3549590, Patent Document 1, and Japanese Patent No. 3585959, Patent Document 2, for example).

As for this type of inertia sensor, for example, in a situation where the vibrator of this inertia sensor is vibrated at predetermined time cycle in the Z-axis direction and in the case where the object having attached thereto this acceleration and angular velocity sensor carries out the angular velocity movement by assuming the X-axis as a rotation axis, a physical phenomenon in which the Coriolis force towards the Y-axis direction acts on the movable body, is used, and the displacement amounts of the movable body in accordance with a magnitude of this Coriolis force is detected, whereby a magnitude of the angular velocity which acts on the object by assuming the X-axis as a rotation axis may be detected.

However, since these inertia sensors separate the displacement of the acceleration and the angular velocity obtained from one movable body by means of signal processing, it is not possible to obtain a sufficient S/N ratio (Signal to Noise Ratio) with respect to a cross-axis sensitivity and a disturbance noise, and an usable application is limited.

Then, the applicant of the present invention has proposed a small inertia sensor which can obtain the sufficient S/N ratio with respect to the cross-axis sensitivity or the disturbance noise, and can detect 3-axis acceleration and a 3-axis angular velocity (see Japanese Patent Application Publication No. JP 2006-167760, Patent Document 3).

Since the inertia sensor as disclosed in Patent Document 3 has a plurality of movable bodies (vibrators), it is necessary to use a detector circuit for detecting the displacement of the plurality of movable bodies.

As a technology of detecting a capacitance value of a variable capacitance element constituted by a plurality of movable bodies by means of few detection systems, there is a technology of detecting a difference in capacitance value between two variable capacitance elements constituted by the respective movable bodies and detecting the displacement of each movable body as disclosed in Japanese Patent Application Publication No. JP H10-239196, Patent Document 4.

However, the structural body in Patent Document 4 is a structural body used in order to detect only the acceleration, does not need to vibrate each movable body, and is different in structure from the structural body of Patent Document 3 which is used in order to detect not only the acceleration but also the angular velocity. Thus, it is difficult to apply the technology of Patent Document 4 to the structural body as disclosed in Patent Document 3.

SUMMARY OF THE INVENTION

Thus, the first embodiment of the present invention provides a detector device in which a plurality of variable blocks where a variable capacitance element is formed whose capacitance value changes in accordance with applied inertial force and a fixed block where a fixed capacitance element is formed whose capacitance value is fixed are provided in which the variable block reciprocally vibrates in a predetermined direction, to detect a value of the applied inertial force based on the capacitance value of the capacitance element of the structure body. The detector device includes a drive circuit for outputting a drive pulse signal for displacing the variable block, a detection pulse signal applying unit by which the variable capacitance elements and the fixed capacitance element whose one end is connected in common are respectively supplied, at their other ends, with detection pulse signals with a plurality of phases each having a predetermined phase difference at a timing synchronized with the drive pulse signal, and an inertia detection unit for detecting a difference in capacitance value between the variable capacitance elements to which the detection pulse signal having the phase difference is applied, or between the fixed capacitance element and the variable capacitance element, and detecting the applied inertial force based on the difference.

The second embodiment of the present invention provides the detector device according to the first embodiment, in which the detection pulse signal applying unit sequentially applies detection pulse signals with different polarities to the fixed capacitance element and two or more of the variable capacitance elements respectively, and sequentially applies detection pulse signals with different polarities to two or more of the variable capacitance elements and other two or more of the variable capacitance elements respectively, the inertia detection unit performs summation and subtraction of capacitance values of the plurality of variable capacitance elements by means of the detection pulse signal, and respectively outputs signals according to an angular velocity at each detection axis and acceleration at each detection axis among the applied inertial forces.

The third embodiment of the present invention provides the detector device according to the first embodiment, in which the detection pulse signal applying unit sequentially applies detection pulse signals with different polarities to the fixed capacitance element and the variable capacitance elements, respectively, and the inertia detection unit detects a deviation in capacitance value of each of the variable capacitance elements by the detection pulse signal.

The fourth embodiment of the present invention provides the detector device according to any one of the first to third embodiments, in which the detection pulse signal applying unit changes a voltage amplitude of the detection pulse signal according to the capacitance element which applies the detection pulse signal.

The fifth embodiment of the present invention provides the detector device according to any one of the first to fourth embodiments, in which the detection pulse signal applying unit applies the detection pulse signal for detecting the angular velocity to the capacitance element during a predetermined period before and after when a displacement rate of the variable block becomes the maximum, and the detection pulse signal for detecting the acceleration is applied to the capacitance element during a predetermined period before and after when the displacement rate of the variable block becomes the minimum.

The sixth embodiment of the present invention provides the detector device according to any one of the first to fourth embodiments, in which the detection pulse signal applying unit applies the detection pulse signal to the capacitance element during a predetermined period before and after when a displacement rate of the variable block becomes the maximum.

The seventh embodiment of the present invention provides the detector device according to any one of the first to sixth embodiments, in which the detector device includes a displacement-detecting variable capacitance element constituted by the variable block and an electrode provided by facing this variable block, a displacement-detecting pulse signal applying unit for applying a displacement detecting pulse signal to the displacement-detecting variable capacitance element, a displacement detection unit for detecting a displacement state of the variable block from the capacitance value of the displacement-detecting variable capacitance element, the capacitance value being detected by the displacement detecting pulse signal applied by the displacement-detecting pulse signal applying unit. The displacement-detecting pulse signal applying unit applies the displacement detecting pulse signal to the displacement-detecting variable capacitance element during a predetermined period before and after when the displacement amounts of the variable block becomes the maximum.

The eighth embodiment of the present invention provides the detector device according to any one of the first to seventh embodiments, in which the detection pulse signal applying unit does not apply the detection pulse signal to the capacitance element at a rising edge or a falling edge of the drive pulse signal.

The ninth embodiment of the present invention provides the detector device according to any one of the first to eighth embodiments, in which the detection pulse signal applying unit is provided with a shift circuit for shifting a phase of the detection pulse signal or the drive pulse signal so that the detection pulse signal may not be at the rising edge or the falling edge at the rising edge or the falling edge of the drive pulse signal.

The tenth embodiment of the present invention provides an inertia sensor having a structural body provided with a plurality of variable blocks where a variable capacitance element is formed whose capacitance value changes in accordance with applied inertial force and a fixed block where a fixed capacitance element is formed whose capacitance value is fixed, in which the variable block reciprocally vibrates in a predetermined direction, and a detector device for detecting a value of the applied inertial force based on the capacitance value of the capacitance element of the structural body. The detector device includes a drive circuit for outputting a drive pulse signal for displacing the variable block, a detection pulse signal applying unit by which the variable capacitance elements and the fixed capacitance element whose one end is connected in common are respectively supplied, at their other ends, with detection pulse signals with a plurality of phases each having a predetermined phase difference at a timing synchronized with the drive pulse signal, and an inertia detection unit for detecting a difference in capacitance value between the variable capacitance elements to which the detection pulse signal having the phase difference is applied, or between the fixed capacitance element and the variable capacitance element, and detecting the applied inertial force based on the difference.

According to embodiments of the present invention, the structural body provided with the plurality of variable blocks where the variable capacitance element is formed whose capacitance value changes in accordance with applied inertial force and the fixed block where the fixed capacitance element is formed whose capacitance value is fixed, in which the variable block is allowed to reciprocally vibrates in the predetermined direction, may be constituted by detection systems whose number is smaller than the number of the capacitance elements in order to detect the capacitance value of these capacitance elements.

BRIEF DESCRIPTION OF THE DRAWINGS

FIG. 5 is a view showing a relationship between the movable body of the variable block and a detection substrate;

FIG. 6 is a view showing a relationship between the movable body of the variable block and the detection substrate;

FIG. 14 is a chart showing a timing of the detection pulse signal applied to each detection electrode of the structural body under the second operation mode;

FIG. 17 is a chart showing another timing of the detection pulse signal applied to each detection electrode of the structural body.

DETAILED DESCRIPTION OF THE EMBODIMENTS

Figure 1:
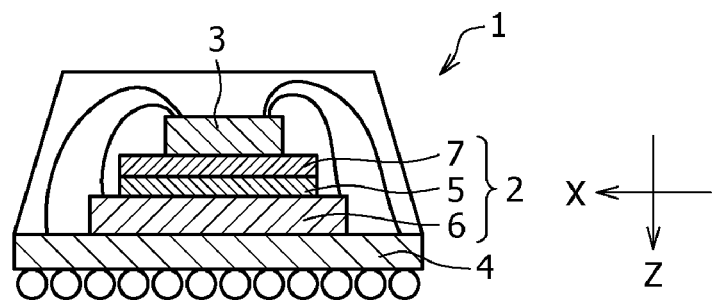
FIG. 1 is a configuration view of an inertia sensor as a whole in the embodiment.

An inertia sensor in the embodiment has a structural body provided with a plurality of variable blocks where a variable capacitance element is formed whose capacitance value changes in accordance with applied inertial force and a fixed block where a fixed capacitance element is formed whose capacitance value is fixed, in which each variable block can be reciprocally vibrated in a predetermined direction, and a detector circuit (equivalent to an example of detector device) for detecting a value of the applied inertial force based on the capacitance values of the variable capacitance element and the fixed capacitance element in which each variable is reciprocally vibrated, thus allowing detection of the angular velocity at three axes and the acceleration at three axes.

The structural body has a plurality of variable blocks, in which one pair of the variable blocks are arranged in a position where laterally symmetrical and another pair of the variable blocks are arranged in a position where anteroposteriorly symmetrical respectively with a predetermined part as a center. A pair of (two) variable blocks, which are located laterally symmetrically, vibrate reciprocally in anti-phase in the lateral direction (right and left direction), and another pair of (two) variable blocks, which are located anteroposteriorly symmetrically, vibrate reciprocally in anti-phase in the anteroposterior direction (front to back direction). Noted, it is assumed here that the lateral direction is the X-axis direction, the anteroposterior direction is the Y-axis direction, and the vertical direction is the Z-axis direction.

Each variable block having formed thereon an electrode is provided with at least a movable body which can be displaced in a direction orthogonal to the vibrating direction. Further, each variable block has an electrode of the movable body and a plurality of detection electrodes which face the electrode and are provided by having a predetermined gap, whereby each variable capacitance element whose capacitance value changes in accordance with the displacement of the movable body is formed.

Further, the structural body is provided with the fixed block having formed thereon an electrode, detection electrodes are provided which face the electrode and are provided by having a predetermined gap, and the fixed capacitance element (hereinafter referred to as "fixed capacitance element Cd") with a fixed capacitance value is formed between these electrodes.

Here, in the structural body in the embodiment, two variable capacitance elements are formed per each variable block in order to detect inclination of the movable body on XZ plane or YZ plane, and parallel translation towards the Z-axis direction.

Assuming that a capacitance value of the variable capacitance element (hereinafter referred to as "variable capacitance element Ca1") behind the variable block on the left side in the lateral (X-axis) direction is X1, a capacitance value of the variable capacitance element (hereinafter referred to as "variable capacitance element Ca2") in front of it (Ca1) is X2, a capacitance value of the variable capacitance element (hereinafter referred to as "variable capacitance element Ca3") behind the variable block on the right side in the lateral (X-axis) direction is X3, a capacitance value of the variable capacitance element (hereinafter referred to as "variable capacitance element Ca4") in front of it (Ca3) is X4, a capacitance value of the variable capacitance element (hereinafter referred to as "variable capacitance element Ca5") on the left side of the variable block in front in the anteroposterior (Y-axis) direction is Y1, a capacitance value of the variable capacitance element (hereinafter referred to as "variable capacitance element Ca6") on the right side of it (Ca5) is Y2, a capacitance value of the variable capacitance element (hereinafter referred to as "variable capacitance element Ca7") on the left side of the variable block behind in the anteroposterior (Y-axis) direction is Y3, a capacitance value of the variable capacitance element (hereinafter referred to as "variable capacitance element Ca8") of the right side of it (Ca7) is Y4, and deviations of the capacitance values X1 to X4 and Y1 to Y4 of the respective variable capacitance elements as $\Delta X1$ to $\Delta X4$, and $\Delta Y1$ to $\Delta Y4$, then physical quantities of the angular velocity and acceleration at each axis may be lead from the following formulae. A particular principle will be described later separately. Further, when one or more arbitrary variable capacitance elements are shown among the variable capacitance elements Ca1 to Ca8, it may be generally referred to as "variable capacitance element Ca".

X-axis angular velocity: $(\Delta Y1+\Delta Y2)-(\Delta Y3+\Delta Y4)$
Y-axis angular velocity: $(\Delta X1+\Delta X2)-(\Delta X3+\Delta X4)$
Z-axis angular velocity: $(\Delta X1-\Delta X2)-(\Delta X3-\Delta X4)+(\Delta Y1-\Delta Y2)-(\Delta Y3-\Delta Y4)$
X-axis acceleration: $(\Delta Y1-\Delta Y2)+(\Delta Y3-\Delta Y4)$
Y-axis acceleration: $(\Delta X1-\Delta X2)+(\Delta X3-\Delta X4)$
Z-axis acceleration: $(\Delta X1+\Delta X2+\Delta X3+\Delta X4+\Delta Y1+\Delta Y2+\Delta Y3+\Delta Y4)$ The detector circuit is provided with the detection pulse signal applying unit by which the variable capacitance elements Ca1-Ca8 and the fixed capacitance element Cd whose one end is connected in common are respectively supplied, at their other ends, with detection pulse signals with a plurality of phases each having a predetermined phase difference (hereinafter referred to as "detection pulse signals), and the inertia detection unit for detecting a difference in capacitance value between the variable capacitance elements Ca to which the detection pulse signal having the phase difference is applied, or between the fixed capacitance element Cd and the variable capacitance element Ca, and detecting the applied inertial force based on the difference.

Let the capacitance value difference detected in this inertia detection unit be the difference between the capacitance value (here capacitance value is W) of the fixed capacitance element Cd and each of the capacitance values X1 to X4 and Y1 to Y4 of a respective one of the variable capacitance elements Ca1 to Ca8, $\Delta X1$ to $\Delta X4$ and $\Delta Y1$ to $\Delta Y4$ are detected which are deviations in capacitance value of the respective variable capacitance elements Ca1 to Ca8. In other words, the detection pulse signal applying unit applies the detection pulse signals with different polarities to the fixed capacitance element Cd and the respective variable capacitance elements Ca sequentially by corresponding to the respective variable capacitance elements Ca, and the inertia detection unit detects the deviation in capacitance value of each variable capacitance element Ca from a voltage of one terminal of the capacitance elements Ca and Cd which are connected in common. For example, when the capacitance value of the fixed capacitance element Cd and the capacitance values X1 to X4 and Y1 to Y4 of the respective variable capacitance elements Ca1 to Ca8 are in the initial state (state where variable block is not vibrating) and of at the same capacitance value and further the detection pulse signals have the same voltage amplitude value, then $W-(X1+\Delta X1)=\Delta X1$, $W-(X2+\Delta X2)=\Delta X2$ is satisfied, . . . and the deviations $\Delta X1$, $\Delta X2$, . . . in capacitance value of the respective variable capacitance elements Ca are detected. Thus, by detecting the deviations in capacitance value of the respective variable capacitance elements Ca1 to Ca8, the angular velocities at three axes and the acceleration at three axes applied to the above-described structural body may be detected.

Further, it is possible to detect a difference between a capacitance value to be summed of the variable capacitance element Ca and a capacitance value to be subtracted of the variable capacitance element Ca among the variable capacitance elements Ca1 to Ca8. For example, when detecting the angular velocity in the X-axis direction, the detection pulse signal is first applied to the variable capacitance elements Ca5 and Ca6, and then the detection pulse signal whose polarity is inverted is applied to the variable capacitance elements Ca7 and Ca8, to detect $(\Delta Y1+\Delta Y2)-(\Delta Y3+\Delta Y4)$. Further, when detecting the angular velocity in the Y-axis direction, the detection pulse signal is first applied to the variable capacitance elements Ca1 and Ca2, and then the detection pulse signal whose polarity is inverted is applied to the variable capacitance elements Ca3 and Ca4, to calculate $(\Delta X1+\Delta X2)-(\Delta X3+\Delta X4)$.

Here, when detecting the acceleration in the Z-axis direction, since it is necessary to detect $(\Delta X1+\Delta X2+\Delta X3+\Delta X4+\Delta Y1+\Delta Y2+\Delta Y3+\Delta Y4)$, electrostatic capacities of all the variable capacitance elements Ca1 to Ca8 are summed up. Then, the detection pulse signal is first applied to the fixed capacitance element Cd, and next the detection pulse signal whose polarity is inverted is applied to all the variable capacitance elements Ca1 to Ca8.

Thus, when there are both types of variable capacitance elements to be summed and subtracted among the variable capacitance elements Ca1 to Ca8, the detection pulse signal applying unit sequentially applies the detection pulse signals whose polarities are mutually inverted only to the variable capacitance elements at different timings. When there is only one type of variable capacitance elements to be summed or subtracted among the variable capacitance elements Ca1 to Ca8, it is arranged that the detection pulse signals whose polarities are inverted mutually are applied to the fixed capacitance element Cd and the variable capacitance element Ca one by one at different timings. Accordingly, the inertia detection unit performs the summation and subtraction of the capacitance values of the variable capacitance elements, omits the latter stage operation processing, and easily detects the signal according to the physical quantity of the acceleration at each detection axis (for three axes of XYZ) and the angular velocity at each detection axis (for three axes of XYZ) by means of a simple structure.

DC offset in the inertia detection unit is caused due to a variation in capacitance value because of the individual differences of the capacitance elements Ca1-Ca8 and Cd in the structural body. So, in the detection pulse signal applying unit of the detector circuit in the embodiment, this DC offset is adjusted by adjusting each amplitude of the detection pulse signal applied to each capacitance element. As a result, the angular velocity and the acceleration can be detected with high precision, without enlarging the dynamic range of the inertia detection unit.

Further, in order to displace and reciprocally vibrate the variable block, the detector circuit has a drive circuit which outputs a drive pulse signal. At a timing synchronized with this drive pulse signal, the detection pulse signal applying unit outputs the detection pulse signal to the variable capacitance element Ca and the fixed capacitance element Cd, whereby the angular velocity and the acceleration are detected.

It is arranged that outputting of the detection pulse signal from the detection pulse signal applying unit is carried out during a predetermined period before and after when a displacement speed of the variable block becomes the maximum. Accordingly, it is possible to omit the circuit (for example, synchronous detection circuit) for extracting a difference in capacitance value of the capacitance element from the output of an inertia detection unit when the displacement speed of the variable block is the maximum. Further, it is also possible to aim to reduce power consumption. Furthermore, Coriolis force becomes the maximum when the displacement speed of the variable block becomes the maximum, and thus it is possible to detect the angular velocity with sufficient accuracy.

Still further, outputting of the detection pulse signal for detecting the acceleration may not be carried out at the above-described period but may be carried out during a predetermined period before and after when the displacement speed of the variable block becomes the minimum (around a point where Coriolis force becomes the minimum), whereby a S/N ratio is improved and the acceleration may be detected with high precision. It should be noted that in the case where S/N is not an issue, it is possible to output the detection pulse signal for detecting the acceleration when the displacement speed of the variable block is the maximum.

Further, the detector circuit is provided with a variable block displacement detector circuit (equivalent to an example of displacement detection unit) which detects the displacement position of the variable block and the maximum displacement amounts. Among the above-described four variable blocks, the electrodes are formed on at least two variable blocks whose vibration directions are orthogonal to each other at least, and the variable capacitance elements (hereinafter referred to as "variable capacitance elements Cf1 and Cf2", equivalent to an example of displacement-detecting variable capacitance element) are formed respectively between these electrodes and displacement detection electrodes provided in positions which face the electrodes by having a predetermined gap. By connecting one end of each of these variable capacitance elements Cf1 and Cf2 in common, and alternately applying the displacement detecting pulse signals whose polarities are mutually different to their other ends respectively from a displacement-detecting pulse signal applying unit, the variable block displacement detector circuit detects the difference in capacitance value of these variable capacitance elements Cf1 and Cf2 from the voltage of one end of the variable capacitance elements Cf1 and Cf2 connected in common, to detect the displacement of the variable block.

Based on the displacement position of the variable block detected by this variable block displacement detector circuit and the maximum displacement amounts, the drive circuit generates the drive pulse signal and applies the signal to the variable block. Accordingly, the variable block is caused to self-excitedly vibrate.

Further, the variable block displacement detector circuit is arranged to apply the displacement detecting pulse signal near the point where the displacement amounts of the variable block is the maximum (predetermined period before and after the maximum point), whereby power consumption can be saved and the displacement of the variable block can be detected with sufficient accuracy. In particular, a band path filter et al required to take out an amplitude becomes unnecessary, and the circuit can be simplified, compared to a circuit which always applies the displacement detecting pulse signal, to detect information about the point where the displacement of the variable block becomes the maximum from the information on the displacement of the variable block obtained by the constant application of the displacement detecting pulse signal.

If the detection pulse signal applying unit outputs the detection pulse signal at a timing synchronized with the drive pulse signal, and an edge of the drive pulse signal and an edge of the detection pulse signal become the same timing, then there is a possibility that high frequency components of the rising and falling edge portions of the drive pulse signal may affect the inertia detection unit etc., acting as noises through parasitic capacitance.

Thus, in the detection pulse signal applying unit in this embodiment, near the rising edge or near the falling edge of the drive pulse signal, the detection pulse signal by a predetermined period (for example, by one period or two periods) is not outputted but masked. Accordingly, noise effects to the inertia detection unit etc. by the edge portion of the drive pulse signal may be suppressed.

Further, in order that the detection pulse signal may not be at the rising edge or the falling edge when the drive pulse signal is at the rising edge or the falling edge, the detection pulse signal applying unit is provided with a phase shift circuit for shifting the phase of the drive pulse signal or the detection pulse signal, and by the thus simple configuration, the effects similar to the above may be obtained.

Below, a particular example of the inertia sensor in this embodiment will be described in more detail with reference to the drawings. FIG. 1 is a structure view of an inertia sensor as a whole in this embodiment, and FIG. 2 is an view for explaining a structure of the inertia sensor in this embodiment.

An inertia sensor 1 in this embodiment has a function to detect the angular velocities at three axes, and the acceleration at three axes. This inertia sensor 1 is constituted by devices referred to as MEMS (Micro Electro Mechanical Systems). As shown in FIG. 1, the inertia sensor is provided with a structural body 2 in which an internal state changes in accordance with the applied inertial force, a detector circuit 3 (equivalent to an example of detector device of the present invention) for detecting a state inside the structural body 2 and detect the inertial force applied to the inertia sensor 1, and a base 4 having mounted thereon the structural body 2 on which the detector circuit 3 is mounted. In addition, wiring between the structural body 2 and the detector circuit 3 and wiring between the detector circuit 3 and the base 4 are performed by wire bonding etc. Further, the inertia sensor 1 is constituted by BGA (Ball Grid Array) package and bumps are arranged in the shape of a lattice at the lower part (opposite of mounting side of structural body 2) of the base 4, however, a LGA (Land Grid Array) package may be adopted.

Figure 2:
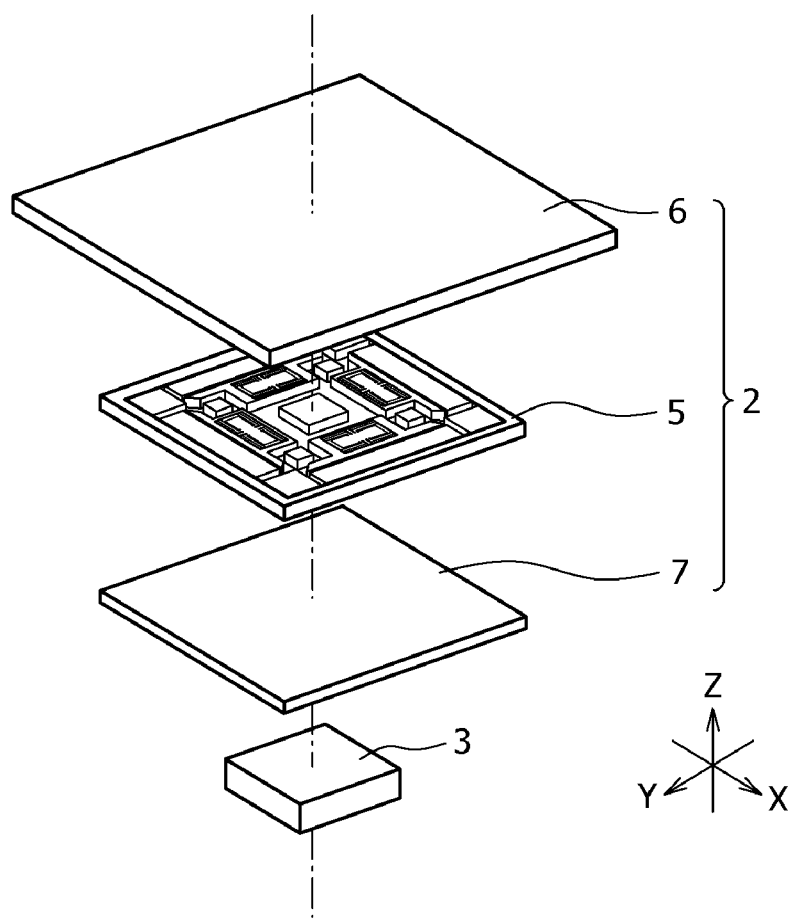
FIG. 2 is a view for explaining a structure of the inertia sensor in the embodiment.

As shown in FIGS. 1 and 2, the structural body 2 has a sensor substrate 5 which is constituted by an SOI (Silicon on Insulator) substrate, and to which the movable body (vibrator) whose internal state changes in accordance with the inertial force is formed, a detection substrate 6 which is constituted by a Si (Silicon) substrate, and in which electrodes (detection electrode, drive monitor electrode, etc. which are described later) facing one side face of the sensor substrate 5 are arranged, and a cap substrate 7 which is similarly constituted by a Si (Silicon) substrate and faces the other side face of the sensor substrate 5. Further, the sensor substrate 5 is sandwiched between the detection substrate 6 and the cap substrate 7, and the inside is sealed with a decompression state.

The inertia sensor 1 configured as described above will be described specifically with reference to the drawings in order of the structural body 2 and the detector circuit 3.
(Configuration of Structural Body 2)

Figure 3:
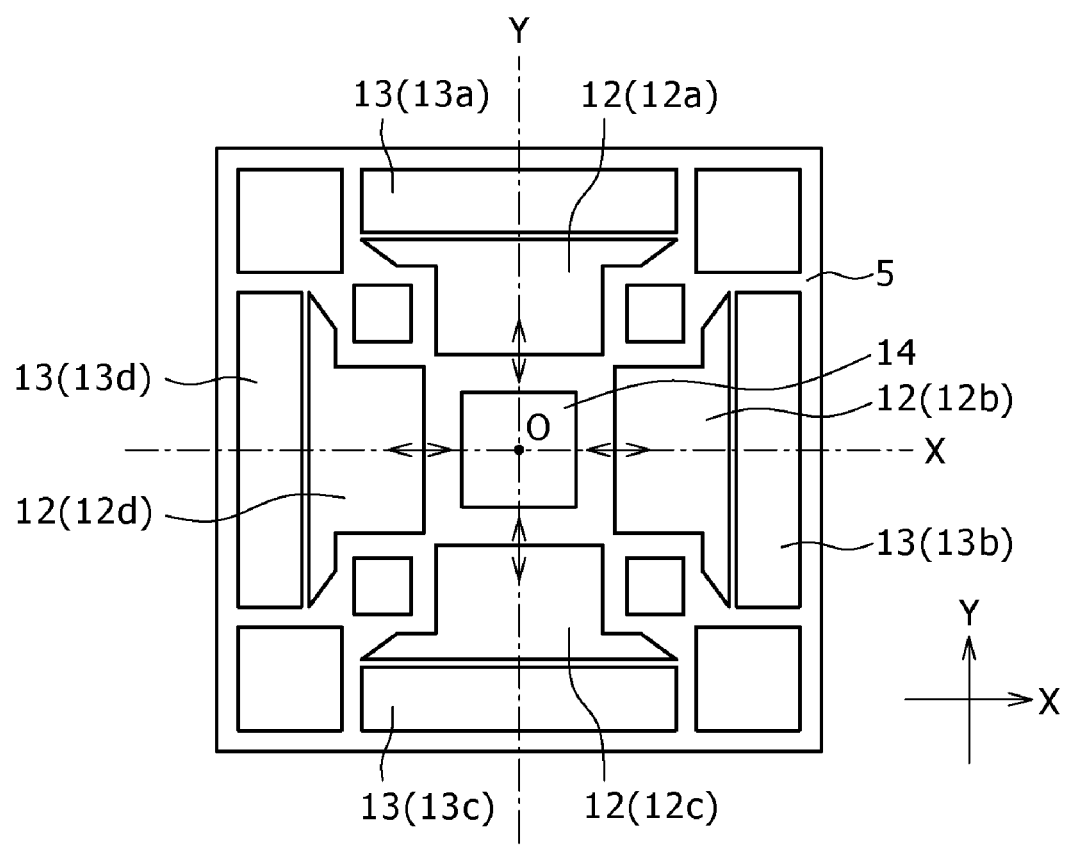
FIG. 3 is a view for explaining a structural body of the inertia sensor in the embodiment.

This structural body 2 will be described still more particularly with reference to FIG. 3. FIG. 3 is a view for explaining the structural body 2 of the inertia sensor 1, and shows a plane layout of the sensor substrate 5.

As shown in FIG. 3, the sensor substrate 5 of the structural body 2 is provided with variable blocks 12 (12a-12d) which allow displacement, drive electrodes 13 (13a-13d) which reciprocally vibrate the respective variable blocks 12 in a predetermined direction, a fixed block 14, and the like.

Two pairs of the variable blocks 12 are respectively arranged on the X-axis and the Y-axis of the sensor substrate 5, in the positions mutually symmetrical with an origin O in the center. In other words, the variable blocks 12a and 12c are arranged on the Y-axis of the sensor substrate 5 and in the positions mutually symmetrical with respect to the origin O, and the variable blocks 12b and 12d are arranged on the X-axis of the sensor substrate 5 and in the positions mutually symmetrical with respect to the origin O.

The variable blocks 12a and 12c are reciprocally vibrated in the Y-axis direction by the drive electrodes 13a and 13c, respectively. The variable blocks 12b and 12d are reciprocally vibrated in the X direction by the drive electrodes 13b and 13d, respectively.

Thus, as for the structural body 2 of the inertia sensor 1 in the embodiment, two pair of variable blocks 12 (12b and 12d, 12a and 12c) are arranged on the X-axis and the Y-axis of the sensor substrate 5 respectively in the positions mutually symmetrical with the origin O in the center. Reference vibrations are provided for vibrating the variable blocks 12b and 12d and the variable blocks 12a and 12c reciprocally and orthogonally on the X-axis and the Y-axis. The reference vibrations are performed in order to detect the angular velocity, including such anti-phase vibrations along the X-axis and the Y-axis as well as rotating vibrations allowing vibrations in a direction of rotation with the origin O in the center.

Figure 4A:
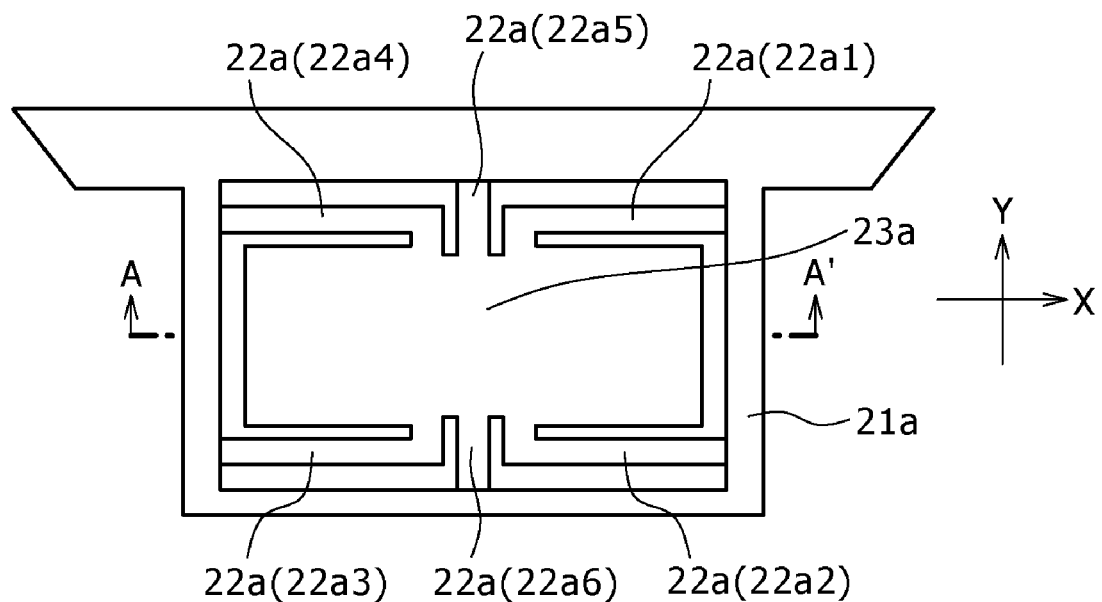
FIG. 4(*a*) shows a plane layout of a variable block, and FIG. 4(*b*) is a sectional view taken along line A-A' of FIG. 4(*a*)
Figure 4B:
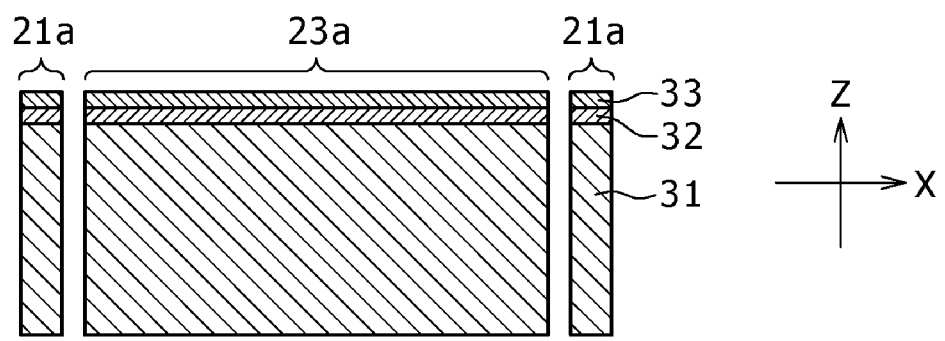

Here, each of the variable blocks 12a-12d will be described with reference to FIG. 4. FIG. 4(a) shows a plane layout of the variable blocks 12, and FIG. 4(b) is a sectional view taken along line A-A' of FIG. 4(a). In FIG. 4, among the variable blocks 12a-12d, the variable block 12a will be described by way of example.

As shown in FIGS. 4(a) and 4(b), the variable block 12a is provided with elastic support beams 22a (22a1 to 22a6) whose one end side is supported by a support part 21a, and a movable body 23a supported by the other end side of each elastic support beam 22a. This movable body 23a is formed in a shape symmetrical with respect to the Y-axis with the origin O in the center.

The support part 21a, the elastic support beam 22a, and the movable body 23a are formed by using the SOI substrate, for example. This SOI substrate is obtained by laminating a base silicon layer 31, an insulating layer (BOX layer as an example) 32, and a silicon active layer 33 in order from the bottom.

The support part 21a and the movable body 23a are each constituted by three layers, the base silicon layer 31, the insulating layer 32, and the silicon active layer 33, and the elastic support beam 22a is constituted by the silicon active layer 33. Therefore, the movable body 23 is supported by the elastic support beams 22a (22a1 to 22a6) of the silicon active layer 33 in a manner the movable body is hung, and flexibility in a direction parallel to the Z-axis and freedom of rotation with the Y-axis at the center is allowed. Noted, the movable body 23a is fixed to the support part 21a in a state where the movable body has high rigidity in the vibrating direction of the variable block 12a (in the Y-axis direction) and has low rigidity in the direction perpendicular to the vibrating direction (in the X-axis direction).

In the variable block 12a, the movable body 23a inclines when the force is applied in the X-axis direction. By detecting the inclination, the inertial force applied to the inertia sensor 1 can be detected. Further, in the case where the inertial force is applied in the Z-axis direction, the movable body 23 is displaced in the Z-axis direction. By detecting the displacement amounts, the inertial force may be detected.

Further, the variable blocks 12b-12d have a configuration similar with that of the variable block 12a. By detecting the displacement amounts of each of the movable bodies 23b-23d (not shown), the inertial force applied in the X-axis, the Y-axis, and the Z-axis directions may be detected.

As for the inertia sensor 1 in the embodiment, as a method of detecting the inclination in the X-axis direction and the Y-axis direction and the displacement in the Z-axis direction in the movable bodies 23a-23d, electrostatic detection is employed which is available comparatively easily by ion implantation etc. in a semiconductor process.

Here, a method of detecting the displacement of the movable bodies 23a-23d in the inertia sensor 1 will be particularly described with reference to the drawing. FIGS. 5 and 6 are views showing relationships between the detection substrate 6 and the movable bodies 23a-23d. Further, FIG. 5 is the view showing the relationship between the detection substrate 6 and the movable bodies 23a and 23c of the variable blocks 12a and 12c, and FIG. 6 is the view showing the relationship between the detection substrate 6 and the movable bodies 23b and 23d of the variable blocks 12b and 12d.

As shown in FIGS. 5(a) and 5(b), in the detection substrate 6 arranged at an upper part (silicon active layer 33 side) of the movable body 23a (23c), two pieces of detection electrodes 42a and 43a (42c, 43c), for example, are formed on the surface facing the movable body 23a (23c) with a predetermined gap kept between the movable body 23a (23c). Accordingly, the variable capacitance elements are formed respectively between the detection electrode 42a (42c) and the movable body 23a (23c) and between the detection electrode 43a (43c) and movable body 23a (23c). In addition, these detection electrodes 42a and 43a are formed in the positions symmetrical with respect to the Y-axis with the origin O in a center. Further, the silicon active layer 33 functions as an electrode.

As shown in FIG. 5(c), the inclination in the X-axis direction can be detected by detecting a capacity difference between the variable capacitance element constituted by the detection electrode 42a (42c) and the movable body 23a (23c), and the variable capacitance element constituted by the detection electrode 43a (43c) and movable body 23a (23c).

Further, as shown in FIG. 5(d), the displacement in the Z-axis direction can be detected by detecting a capacity sum of the variable capacitance element constituted by the detection electrode 42a (42c) and the movable body 23a (23c) and the variable capacitance element constituted by the detection electrode 43a (43c) and the movable body 23a (23c).

Further, the movable body 23b (23d) is configured similarly with the movable body 23a (23c). In other words, as shown in FIGS. 6(a) and 6(b), in the detection substrate 6 arranged at the upper part (silicon active layer 33 side) of the movable body 23b, two pieces of detection electrodes 42b and 43b (42d, 43d), for example, are formed on the surface facing the movable body 23b (23d) with a predetermined gap kept between the movable body 23b (23d). Accordingly, the variable capacitance elements are formed respectively between the detection electrode 42b (42d) and the movable body 23b (23d) and between the detection electrode 43b (43d) and the movable body 23b (23d).

As shown in FIG. 6(c), the inclination in the Y-axis direction can be detected by detecting a capacity difference between the variable capacitance element constituted by the detection electrode 42b (42d) and the movable body 23b (23d), and the variable capacitance element constituted by the detection electrode 43b (43d) and movable body 23b (23d). Further, as shown in FIG. 6(d), the displacement in the Z-axis direction can be detected by detecting a capacity sum of the variable capacitance element constituted by the detection electrode 42b (42d) and the movable body 23b (23d), and the variable capacitance element constituted by the detection electrode 43b (43d) and the movable body 23b (23d).

As described above, the force applied in the X-axis direction and the Z-axis direction can be detected by the movable bodies 23a and 23c and the detection electrodes 42a, 43a, 42c, and 43c, and the force applied in the Y-axis direction and the Z-axis direction can be detected by the movable bodies 23b and 23d and the detection electrodes 42b, 43b, 42d, and 43d. Therefore, by using the movable bodies 23a and 23c, it becomes possible to detect the acceleration applied in the X-axis direction and the Z-axis direction. By using the movable bodies 23b and 23d, it is possible to detect the acceleration applied in the Y-axis direction and the Z-axis direction. Thus, each of the variable blocks 12a-12d arranged on the sensor substrate 5 has detection axes of a plurality of axes, and one detection axis of them may be arranged to be perpendicular to the reference vibration.

Now, the reference vibrations of the variable blocks 12a-12d (anti-phase vibrations of X-axis and Y-axis) will be described with reference to the drawings. FIG. 7 shows plane layouts (only variable blocks 12a-12d are extracted) of the sensor substrate 5 in the embodiment.

Figure 7A:
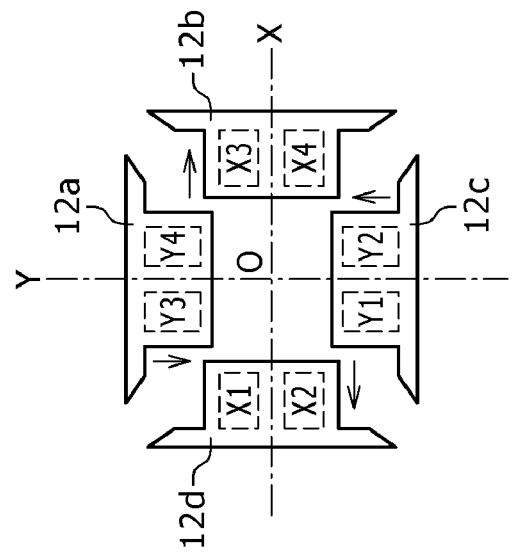
FIG. 7 shows plane layouts of the sensor substrate in the embodiment.

As shown in FIG. 7(a), as for the inertia sensor 1, two pair of variable blocks 12 (12a and 12c, 12b and 12d) are arranged respectively on the X-axis or the Y-axis of the sensor substrate 5 in the positions mutually symmetrical with respect to the origin O. Reference vibrations are provided for vibrating the variable blocks 12 (12a and 12c) and the variable blocks 12 (12b and 12d) reciprocally and orthogonally on the X-axis and the Y-axis.

Figure 7B:
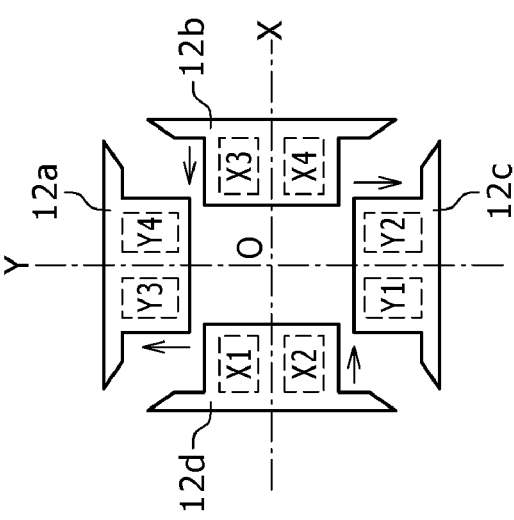
Figure 7C:
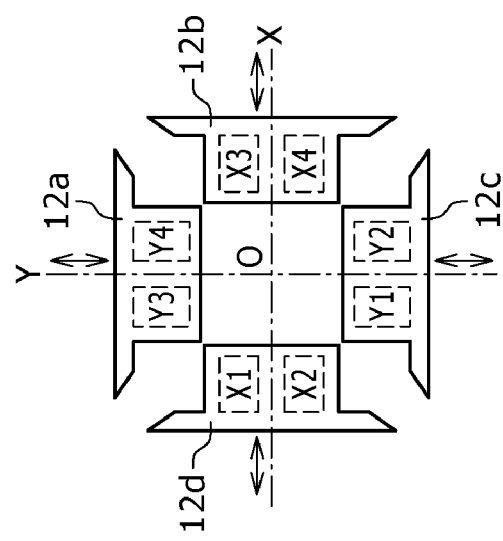

As shown in FIG. 7(b), when the variable blocks 12a and 12c on the Y-axis vibrate in a direction away from the origin O, the variable blocks 12b and 12d at the X-axis vibrate in a direction getting close to the origin O. Further, as shown in FIG. 7(c), when the variable blocks 12a and 12c on the Y-axis vibrate in the direction getting close to the origin O, the variable blocks 12b and 12d at the X-axis vibrate in the direction away from the origin O. Such vibration can be realized by optimizing a resonance mode of the sensor substrate 5.

The application of drive force may be carried out by means of electrostatic force, a piezoelectric element, electromagnetic force, etc. As an example of means that is comparatively easily available in a semiconductor manufacture process, there may be one that uses the electrostatic force. As for the inertia sensor 1 in the embodiment, an example in which the variable blocks 12a-12d are driven by means of the electrostatic force is used for description. It should be noted that, in FIG. 7, it is assumed that the capacitance values of the variable capacitance elements Ca7 and Ca8 (see FIG. 9) formed between the movable body 23a and the detection electrodes 42a and 43a are Y3 and Y4 respectively, the capacitance values of the variable capacitance elements Ca3 and Ca4 (see FIG. 9) formed between the movable body 23b and the detection electrodes 42b and 43b are X3 and X4 respectively, the capacitance values of the variable capacitance elements Ca5 and Ca6 (see FIG. 9) formed between the movable body 23c and the detection electrodes 42c and 43c are Y1 and Y2 respectively, and the capacitance values of the variable capacitance elements Ca1 and Ca2 (see FIG. 9) formed between the movable body 23d and the detection electrodes 42d and 43d are X1 and X2 respectively.

As described above, as for the inertia sensor 1 in the embodiment, the drive electrodes 13 (13a-13d) are arranged respectively in the positions facing the variable blocks 12 (12a-12d). The gap between the variable block 12 (12a-12d) and the drive electrode 13 (13a-13d) is kept by a few µm to a few tens of µm, and the variable block 12 (12a-12d) can be reciprocally vibrated by applying a voltage of a frequency which excites resonance between the drive electrode 13 and variable block 12. In order to secure sufficient driving force, it is also possible to use a comb electrode instead of a parallel plate electrode (see FIG. 3) like the drive electrode 13.

The variable blocks (12a and 12c) and (12b and 12d) are caused to vibrate with anti-phases respectively so that the reference vibrations in two axis directions required for detecting the angular velocities in three axis directions maybe performed.

Figure 8A:
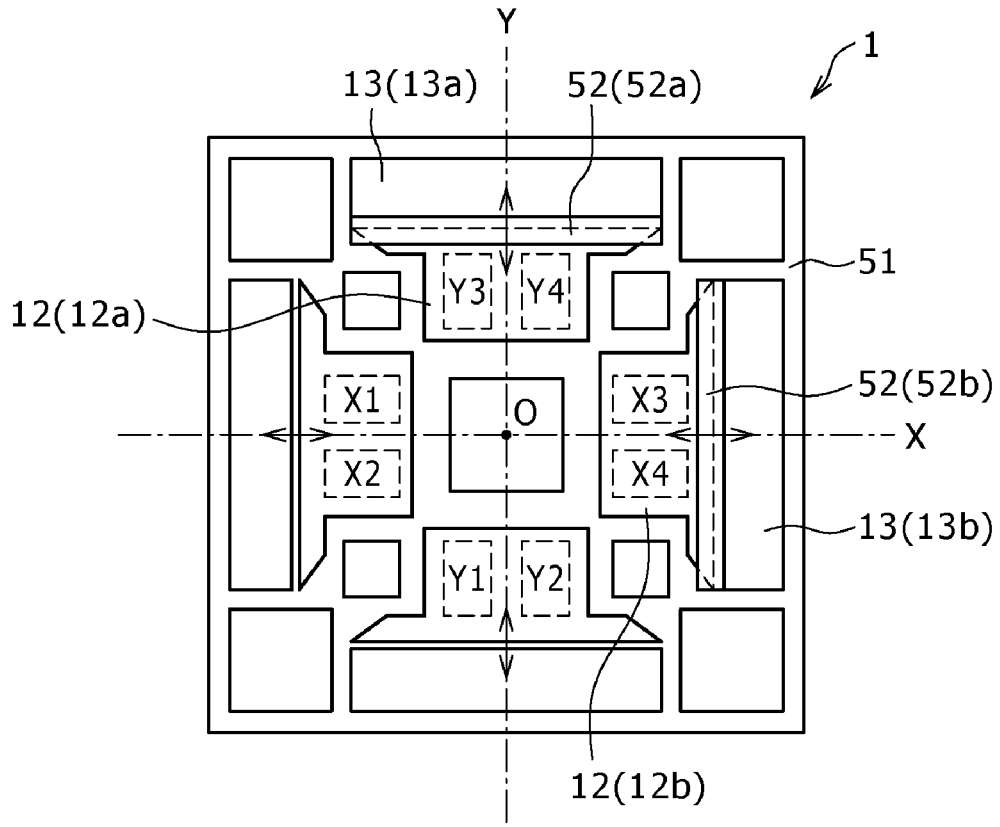
FIG. 8 is a view for explaining a relationship between the variable block and a drive monitor electrode.
Figure 8B:
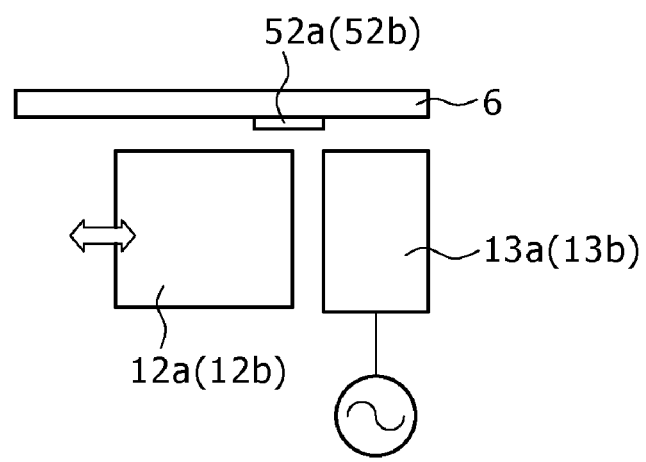

Further, in the inertia sensor 1 in the embodiment, as shown in FIGS. 8(a) and 8(b), drive monitor electrodes 52a and 52b for detecting the positions of the variable blocks 12a and 12b are arranged on the detection substrate 6. FIG. 8 is a view for explaining a relationship between the variable block and the drive monitor electrodes. The variable capacitance elements Cf1 and Cf2 (see FIG. 9, corresponds to examples of displacement-detecting variable capacitance elements) are formed between the variable blocks 12a and 12b and the drive monitor electrodes 52a and 52b respectively. Thus, by detecting the capacitance values of the variable capacitance elements Cf1 and Cf2, it is possible to detect the positions where the variable blocks 12a and 12b are displaced.

(Detection Principle of Angular Velocity and Acceleration)

A detection principle of the angular velocity and the acceleration in the inertia sensor 1 in the embodiment will be described in the following.

Firstly, the detection principle of the angular velocity will be described. While an object having a certain mass is vibrating in a manner moving reciprocally in the Z-axis direction, if rotational motion of an angular velocity ω is carried out about, for example, the X-axis perpendicular to the Z-axis, then a Coriolis force F occurs in the Y-axis direction, and if the rotational motion of the angular velocity ω is carried out about the Y-axis, then the Coriolis force F occurs in the X-axis direction.

This phenomenon is a dynamics phenomenon which has been known as Foucault pendulum since a long time ago, and the generated Coriolis force F is expressed by F=2 m·v·ω, where m is mass of the object and v is an instantaneous velocity with respect to movement of the object, and ω is an instantaneous angular velocity of the object.

This Coriolis force is generated in the direction perpendicular to vibrations. Based on this principle, Coriolis force is not generated in the vibrating direction. Therefore, in a related art vibration-type angular velocity detector device, only the angular velocity up to two axes at the maximum may be detected by one-axis vibration, or the detection in the three axis directions is allowed by carrying out ellipse movement two-dimensionally (equivalent to simultaneous vibrations along two axes).

As for the inertia sensor 1 in the embodiment, as described above, it is possible to detect the angular velocities at three axes and the acceleration at three axes by a plurality of variable blocks 12a-12d to which the reference vibration is applied.

As shown in FIG. 7(b), when the variable blocks 12b and 12d on the X-axis move in a direction of the origin O, the variable blocks 12a and 12c on the Y-axis move away from the origin O. At this time, if an angular velocity Ω is applied around the X-axis, then Coriolis force F=2 mAωΩ is applied to two variable blocks 12a and 12c on the Y-axis in the Z-axis direction, where "A" is the maximum amplitude of the reference vibrations, and "ω" is a frequency of the reference vibrations, and "m" is mass of the movable body 23 of the variable block 12. Since the two variable blocks 12a and 12c on the Y-axis are vibrating in the opposite directions (in anti-phase) with respect to the angular velocity around the X-axis, a direction of the Coriolis force is reverse to the Z-axis direction. By obtaining a difference between the capacitance values detected by these two variable blocks 12a and 12c, the angular velocity around the X-axis may be detected.

Assuming here that the capacitance values (capacitances values when inertial force is not applied to movable bodies 23) of the variable capacitance elements in a initial state which are constituted, as described above, by the respective detection electrodes 42 and 43 (42a-42d, 43a-43d) and the movable bodies 23 (23a-23d) are X1 through X4, and Y1 through Y4, and that the capacitance values of the variable capacitance elements when the inertial force is applied to the movable bodies 23 are (X1+ΔX1) through (X4+ΔX4) and (Y1+ΔY1) through (Y4+ΔY4), the angular velocity Ωx around the X-axis can be expressed by the following formula (1). Noted, Ax is a coefficient. Further, it is assumed that the capacitance values Y1 through Y4 of the variable capacitance elements Ca5-Ca8 in an initial state are the same.

$$\Omega x = Ax\{(\Delta Y1 + \Delta Y2) - (\Delta Y3 + \Delta Y4)\} \quad (1)$$

Similarly, it is also possible to detect the angular velocity about the Y-axis by detecting the displacement in the Z-axis direction of the two variable blocks 12b and 12d on the X-axis. In other words, the angular velocity Ωy about the Y-axis can be expressed by the following formula (2). Noted, Ay is a coefficient. Further, it is assumed that the capacitance values X1 through X4 of the variable capacitance elements Ca1-Ca4 in an initial state are the same.

$$\Omega y = Ay\{(\Delta X1 + \Delta X2) - (\Delta X3 + \Delta X4)\} \quad (2)$$

Further, the angular velocity about the Z-axis can be detected as follows. In other words, when the angular velocity about the Z-axis is applied, each of the movable bodies 23a-23d (see FIG. 3) of a respective variable blocks 12a-12d receives the Coriolis force in a direction orthogonal to the Z-axis respectively, and each of the variable blocks 12a-12d inclines in a direction orthogonal to the Z-axis. The displacements are caused by the inclination, and since the two variable blocks 12a and 12c are directed in the reverse direction and the variable blocks 12b and 12d are directed in the reverse direction on either the X-axis or the Y-axis, it is possible to detect the angular velocity about the Z-axis, if the difference of the blocks are detected. It may only be necessary to obtain the difference between two or more variable blocks, which are in anti-phase, out of the four variable blocks 12a-12d, however the angular velocity about the Z-axis is here detected by using the four variable blocks 12a-12d in order to improve accuracy.

Therefore, the angular velocity Ωz about the Z-axis can be expressed by the following formula (3). Noted, Az is a coefficient. Further, it is assumed that the capacitance values X1 through X4 and Y1 through Y4 of the respective variable capacitance elements Ca1-Ca8 in a initial state are the same.

$$\Omega z = Az[\{(\Delta X1-\Delta X2)-(\Delta X3-\Delta X4)\}+\{(\Delta Y1-\Delta Y2)-(\Delta Y3-\Delta Y4)\}] \quad (3)$$

The detection of the acceleration will be described in the following. In the case where the acceleration is applied in the X-axis direction, the movable bodies 23a and 23c of the two variable blocks 12a and 12c on the Y-axis incline in the X-axis direction. Therefore, the acceleration is obtained by summing the difference in capacitance value between the variable capacitance elements Ca5 and Ca6 in the variable block 12a and the difference in capacitance value between the variable capacitance elements Ca7 and Ca8 in variable block 12d. In other words, acceleration ax in the X-axis direction can be expressed by the following formula (4). Noted, Bx is a coefficient. Further, it is assumed that the capacitance values Y1 through Y4 of the variable capacitance elements Ca5-Ca8 in a initial state are the same.

$$ax = Bx\{(\Delta Y1-\Delta Y2)+(\Delta Y3-\Delta Y4)\} \quad (4)$$

Further, in the case where the acceleration is applied in the Y-axis direction, the movable bodies 23b and 23d of the two variable blocks 12b and 12d on the X-axis incline in the Y-axis direction. Therefore, as similar with the X-axis, the acceleration of a Y-axis direction component can be detected by obtaining a total sum of the difference in capacitance value between the variable capacitance elements Ca3 and Ca4 in the variable block 12b, and the difference in capacitance value between the variable capacitance elements Ca1 and Ca2 in the variable block 12d. In other words, acceleration ay in the Y-axis direction can be expressed by the following formula (5). Noted, By is a coefficient. Further, it is assumed that the capacitance values X1 through X4 of the variable capacitance elements Ca1-Ca4 in the initial state are the same.

$$ay = By\{(\Delta X1-\Delta X2)+(\Delta X3-\Delta X4)\} \quad (5)$$

Further, in the case where the acceleration is applied in the Z-axis direction, since all the movable bodies 23a-23d of the four variable blocks 12a-12d carry out parallel translation in the same direction, the acceleration in the Z-axis direction can be detected by detecting the total capacity change or a capacity change (ΔX1+ΔX2 etc.) of the variable capacitance elements Ca1 and Ca2 in at least one variable block, for example, variable block 12d. In the case where the detection is carried out by the total capacity change, acceleration az in the Z-axis direction can be expressed by the following formula (6). Noted, Bz is a coefficient. Further, it is assumed that the capacitance values X1 through X4 and Y1 through Y4 of the variable capacitance elements Ca1-Ca8 in a initial state are the same.

$$az = Bz(\Delta X1+\Delta X2+\Delta X3+\Delta X4+\Delta Y1+\Delta Y2+\Delta Y3+\Delta Y4) \quad (6)$$

(Detector Circuit)

Figure 9:
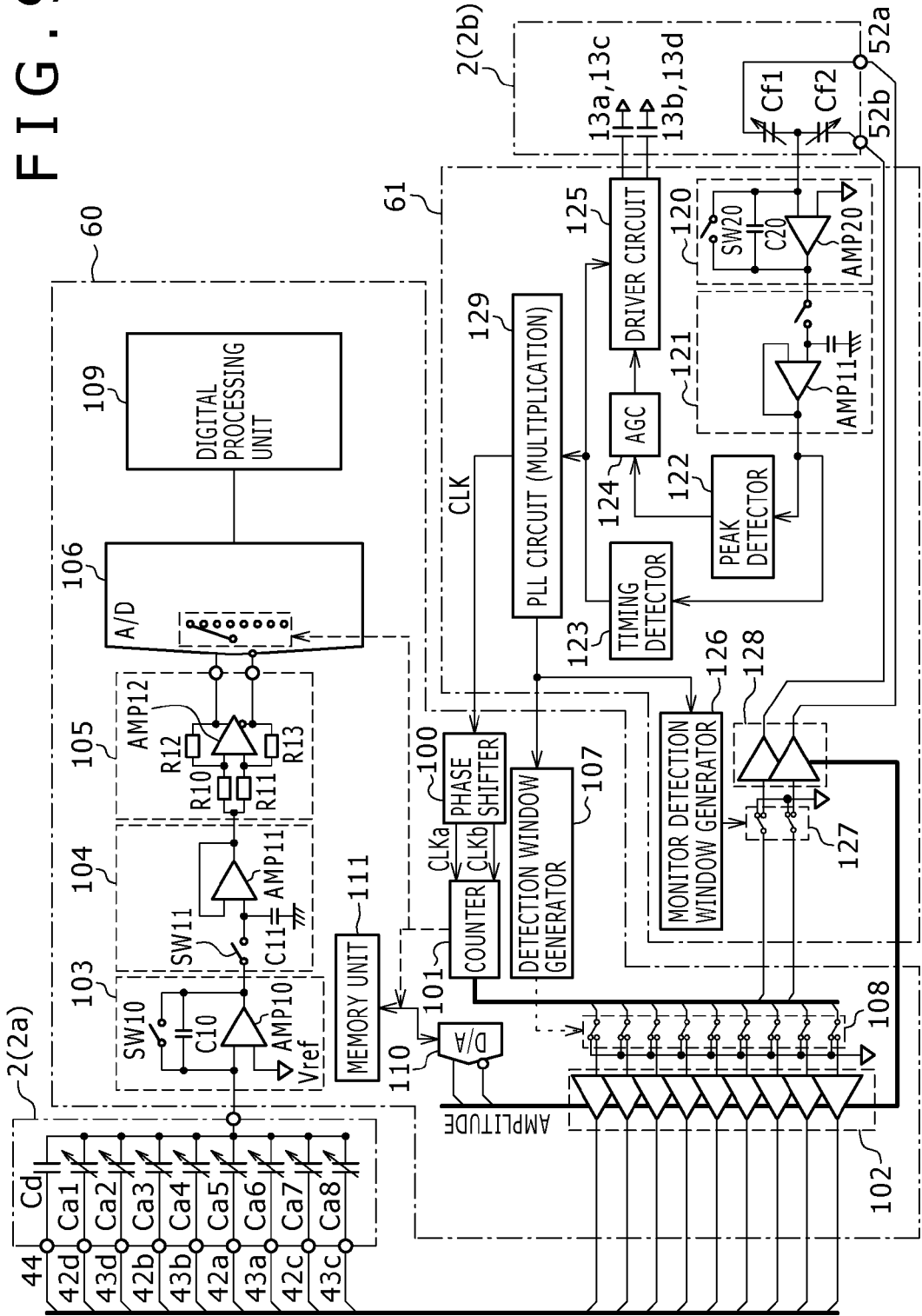
FIG. 9 is a electrical block diagram of the inertia sensor in the embodiment.

Next, the detector circuit 3 will be described with reference to the drawings. FIG. 9 shows an electric block diagram of the inertia sensor 1 in the embodiment.

As shown in FIG. 9, the detector circuit 3 is provided with a detection control unit 60 for detecting a state of the structural body 2 and detecting the angular velocity and acceleration which are applied to the inertia sensor 1, and a drive control unit 61 which applies an alternate current signal to the drive electrodes 13a-13d to cause the variable blocks 12a-12d to reciprocally vibrate, generates the drive pulse signal to be applied to the drive electrodes 13a-13d based on operation of the variable blocks 12a and 12b, further generates a clock signal CLK based on operation of the variable blocks 12a and 12b, and supplies the clock signal CLK to the detection control unit 60.

(Detection Unit)

The detection control unit 60 will be described first. The detection control unit 60 is provided with a phase shifter 100 for generating two pulse signals CLKa and CLKb whose phases are mutually inverted, from the clock signal CLK outputted from the drive control unit 61, a counter circuit 101 for generating a detection pulse signal to be applied to the electrodes (detection electrodes 44, 42a-42d, 43a-43d, and drive monitor electrodes 52a and 52b) of the respective other end of the capacitance elements Ca1-Ca8, Cd, Cf1, and Cf2 whose one end is connected in common, based on the pulse signals CLKa and CLKb, a buffer circuit 102 for respectively amplifying the signals outputted from the counter circuit 101, a charge pump (C/P) circuit 103 which is connected to the electrodes of one end of the capacitance elements Ca1-Ca8, Cd, Cf1, and Cf2, and constitutes a negative feedback circuit with a capacitance element C10 having a predetermined capacitance value, a sample and hold (S/H) circuit 104 which carries out sample and hold at a timing the output signal of the charge pump circuit 103 is synchronized with the detection pulse signal, an amplification circuit 105 which amplifies the output signal of the sample and hold circuit 104, an analog/digital converter 106 for performing digital conversion on the output signal of this amplification circuit 105, and a digital processing unit 109 which carries out digital processing of the output of the analog/digital converter 106. Noted, the variable capacitance elements Ca1-Ca8 are the variable capacitance elements constituted by the detection electrodes 42 and 43 and the movable bodies 23 as described above. The fixed capacitance element Cd is a capacitance element which is constituted by the detection electrode 44 and the fixed block 14 and has a constant capacitance value. The variable capacitance elements Cf1 and Cf2 are variable capacitance elements constituted by the variable blocks 12a and 12b and the drive monitor electrodes 52a and 52b. Further, the detection pulse signal applying unit is constituted by the phase shifter 100, the counter circuit 101, the buffer circuit 102, a detection window generator 107 to be described later, a digital/analog converter 110, and a memory unit 111. One end of the variable capacitance elements Ca1-Ca8 and the fixed capacitance element Cd are connected in common, and to the other en of the elements, the detection pulse signal applying unit applies detection pulse signals with a plurality of phases each having a predetermined phase difference. Furthermore, an inertia detection unit is constituted by the charge pump (C/P) circuit 103, the sample and hold (S/H) circuit 104, the amplification circuit 105, the analog/digital converter 106, and the digital processing unit 109.

Further, the detection control unit 60 has the detection window generator 107 which controls application of the detection pulse signal to the structural body 2. This detection window generator 107 controls a group of switches 108 so that the detection pulse signal is applied to the capacitance elements Ca and Cd of the structural body 2 during only a specific time period (intermittent application). The group of switches 108 are configured such that either the detection pulse signal or a reference voltage Vref respectively outputted from the counter circuit 101 is selected to be applied to the buffer circuit 102. By inputting the clock signal CLK, the detection window generator 107 operates and controls the group of switches 108 based on an amplitude detection pulse and a timing detection pulse which are further inputted from PLL 120 to be described later. In other words, during the time period when the amplitude detection pulse and the timing detection pulse are inputted from PLL 120, the group of switches 108 are controlled and the detection pulse signal is arranged to be applied to the structural body 2.

Here, in the detection control unit 60, the timing of the detection pulse signal applied to each detection electrode from the buffer circuit 102 will be described. In the detection control unit 60 in the embodiment, two types of operation modes, the first operation mode and the second operation mode, may be selected, and each will be described particularly below.

(First Operation Mode)

Figure 10:
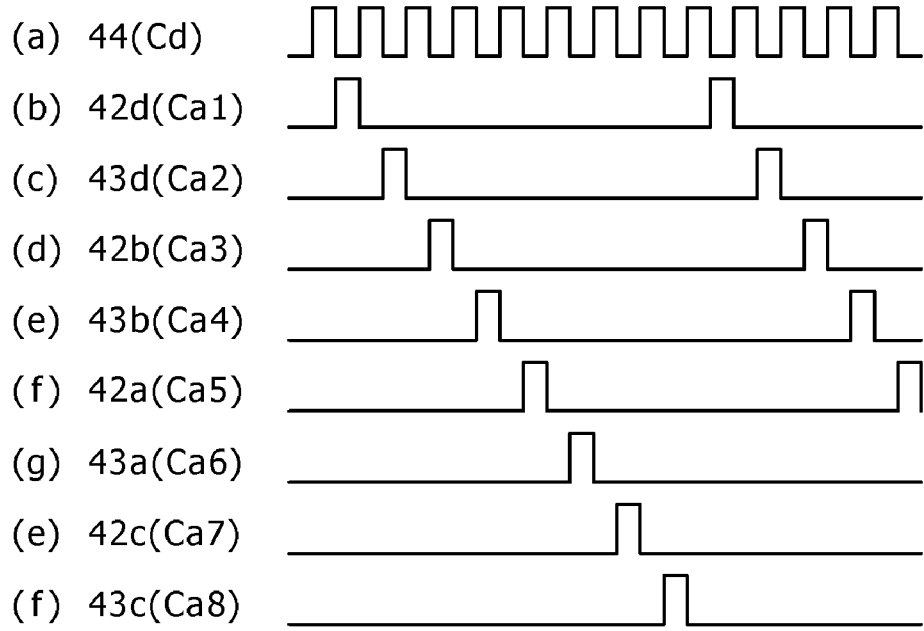
FIG. 10 is a timing chart showing timings of a detection pulse signal applied to each detection electrode of the structural body under the first operation mode.
Figure 11:
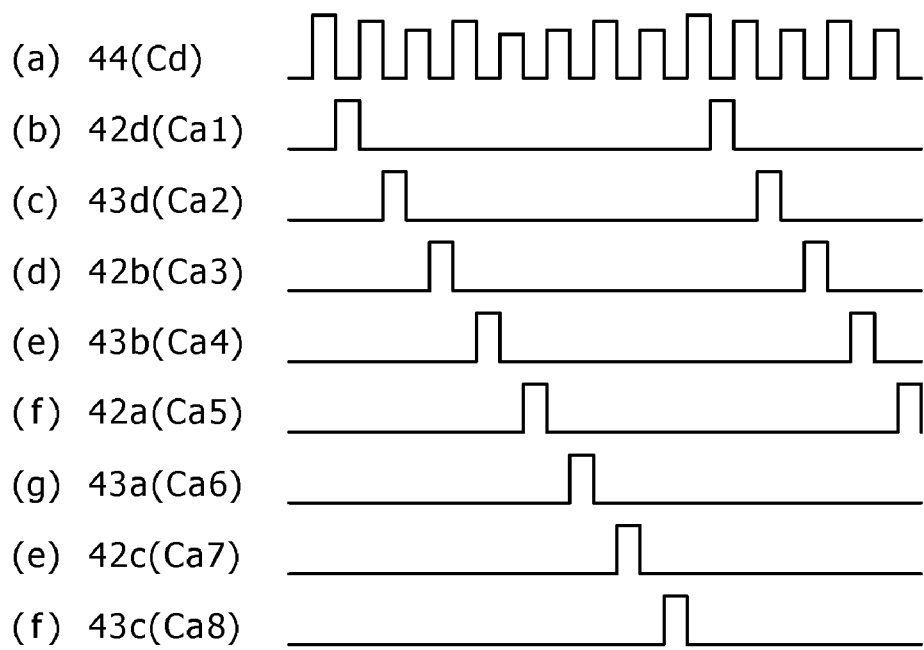
FIG. 11 is a timing chart showing timings of the detection pulse signal applied to each detection electrode of the structural body under the first operation mode.

Firstly, the first operation mode will be described with reference to the drawings. FIGS. 10 and 11 are charts showing the timing of the detection pulse signal applied to each of the detection electrode (44, 42a-42d, 43a-43d) of the structural body 2 in the first operation mode.

In the first operation mode, a continuous detection pulse signal is applied to the detection electrode 44 of the fixed capacitance element Cd which is a fixed capacitance, and the detection pulse signals are applied to the detection electrodes 42d, 43d, 42b, 43b, 42a, 43a, 42c, and 43c of the other variable capacitance elements Ca1-Ca8 time-divisionally by shifting respective phase.

In other words, as shown in FIG. 10, the detection pulse signal generated by the signal CLKa (hereafter, referred to as "detection pulse signal of positive phase") is applied to the detection electrode 44 of the fixed capacitance element Cd. The detection pulse signal generated by the signal CLKb (hereafter, referred to as "detection pulse signal of negative phase") is applied to the detection electrodes 42a-42d and 43a-43d of the variable capacitance elements Ca1-Ca8 sequentially. A polarity of the detection pulse signal applied to the fixed capacitance element Cd and a polarity of the detection pulse signal applied to the variable capacitance elements Ca1-Ca8 are mutually inverted and outputted from the counter circuit 101.

Here, the charge pump circuit 103 is provided with an operation amplifier AMP10, the capacitance element C10 and a switch SW10 which are connected between an inverted input terminal and an output terminal of this operation amplifier AMP10, and a non-inverted input terminal of the operation amplifier AMP10 is connected to the reference voltage Vref.

Each time the detection pulse signal is applied to any of the variable capacitance elements Ca1-Ca8, a voltage according to a difference between the capacitance value of the variable capacitance element Ca to which the detection pulse signal is applied and the capacitance value of the fixed capacitance element Cd is outputted from the operation amplifier AMP10.

Therefore, a voltage signal according to a difference obtained from an initial value of capacitance value of the variable capacitance elements Ca1-Ca8 is sequentially outputted from the charge pump circuit 103. The output from the charge pump circuit 103 is sequentially held temporarily at the sample and hold circuit 104, and the held voltage is amplified by the amplification circuit 105 and outputted to the analog/digital converter 106. In the analog/digital converter 106, the voltage according to the difference obtained from the initial value of capacitance value of the variable capacitance elements Ca1-Ca8 is sequentially digitized and outputted.

Thus, the signal outputted from the analog/digital converter 106 is inputted into the digital processing unit 109. The digital processing unit 109 is provided with a computing unit for calculating each of the above-described formulae (1)-(6) and detects the acceleration at three axes (the X-axis direction, the Y-axis direction, and the Z-axis direction) and the angular velocities about three axes (about the X-axis, about the Y-axis, and about the Z-axis).

The capacitance values of the capacitance elements Ca1-Ca8 and Cd to be detected vary in accordance with an individual difference of the structural body 2. Therefore, if the two variable capacitance elements having such individual differences are detected in the charge pump circuit 103, offset values of the outputs may differ. Thus, there is a possibility that the angular velocity and acceleration may not be detected with high precision.

The detection control unit 60 in the embodiment is arranged to adjust the balance of the voltage value between the detection pulse signals in positive phase and the detection pulse signals in negative phase which are outputted from the buffer circuit 102. In other words, as shown in FIG. 11, the voltage value of the detection pulse signal to be applied is adjusted per each of the detection electrodes 44, 42a-42d, and 43a-43d.

The detection control unit 60 is provided with the digital/analog converter 110 and the memory unit 111, in which based on the signal from the counter circuit 101, amplitude information on each detection pulse signal is read from the memory unit 111, inputted into the digital/analog converter 110, and subjected to analog conversion, and the amplitude of the detection pulse signal outputted from each buffer of the buffer circuit 102 is controlled.

This amplitude information on each of the detection pulse signals is stored in the memory unit 111 according to the individual difference of the structural body 2 at the time of manufacturing the inertia sensor 1. The detection pulse signal may be inputted into each of the capacitance elements Ca1-Ca8 and Cd formed at the structural body 2, the capacitance values of these capacitance elements may be measured, and based on the results, an amount of amplitude to be adjusted may be stored in the memory unit 111 as the amplitude information when each of the variable blocks 12a-12d are not arranged to vibrate reciprocally. In addition, in a PLL circuit 129, a lower limit is set to an internal oscillation frequency, and it is arranged that the clock signal CLK may be outputted even when each of the variable blocks 12a-12d is not arranged to vibrate reciprocally. Therefore, in the detector circuit 3 in the embodiment, even when each of the variable blocks 12a-12d is not arranged to vibrate reciprocally, it is possible to detect the capacitance value of each of the capacitance elements Ca1-Ca8 and Cd.

Figure 12:
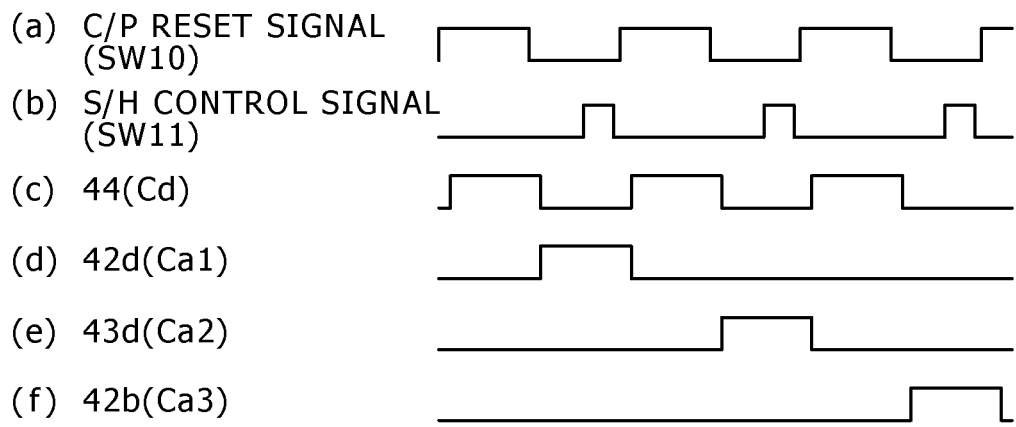
FIG. 12 is a timing chart for explaining operation of a charge pump circuit and a sample hold circuit.

Here, operation of the charge pump circuit 103 and the sample and hold circuit 104 will be particularly described with reference to the drawings. FIG. 12 is a timing chart for explaining the operation of the charge pump circuit and the sample and hold circuit.

As shown in FIG. 12, before the detection pulse signal is applied to the detection electrode 44 (see FIG. 12(c)), the charge pump circuit 103 becomes in a reset state (switch SW10 is in short circuit state). Then, the detection pulse signal is applied to the detection electrode 44, the reset state of the charge pump circuit 103 is canceled (switch SW10 is in an open state) before completion of this application, and the charge pump circuit 103 becomes in operative state.

Next, after the application of the detection pulse signal to the detection electrode 44 is completed and the detection pulse signal is applied to the detection electrodes 42d (43d, 42b), the sample and hold circuit 104 starts the sample and hold operation (switch SW11 is short circuited) and holds the output voltage from the charge pump circuit 103 for a predetermined time period.

Thus, after reset of discharging the capacitance element C10 is performed, the charge pump circuit 103 is connected to the detection electrode 44 (fixed capacitance element Cd), then connected to each of the detection electrodes 42d, 43d, 42b, . . . (variable capacitance elements Ca1, Ca2, Ca3, . . . ), to detect the 5 capacity difference of these capacitance elements.

For example, when detecting the difference between the capacitance value of the fixed capacitance element Cd and the capacitance value of the variable capacitance element Ca1, an output voltage Vout of the charge pump circuit 103 can be expressed by the following formula (7). In addition, it is assumed that Vd is a voltage value of the detection pulse signal applied to the fixed capacitance element Cd, and Va is a voltage value of the detection pulse signal applied to the variable capacitance element Ca1.

[Equation 1]

$$Vout = \frac{\{Cd(Vd - Vref) - Ca1 Vref\} - \{Cd(-Vref) - Ca1(Vref - Va)\}}{Cf} \quad (7)$$
$$= \frac{CdVd - Ca1Va}{Cf}$$

In formula (7), let Cd=Cd+ΔCd and Ca1=Ca1+ΔCa1, the following formula (8) may be provided. It should be noted that, although the variable capacitance element Ca1 changes according to inertial force, the fixed capacitance element Cd is a fixed capacitor, therefore ΔCd=0

[Equation 2]

$$Vout = \frac{VdCd - VaCa1}{Cf} + \frac{Vd\Delta Cd - Va\Delta Ca1}{Cf} \quad (8)$$

Here, the detection pulse signal applied to the fixed capacitance element Cd and the variable capacitance element Ca1 is generated by the counter circuit 101. Assuming that each detection pulse signal has basically the same voltage value in absolute value, and that the capacitance value of the variable capacitance element Ca1 when inertial force is not applied to the inertia sensor 1 and the capacitance value of the fixed capacitance element Cd are the same, the first stage {(VdCd−VaCa1)/Cf} in formula (8) can be set to 0. At this time, the output voltage Vout of the charge pump circuit 103c an be expressed by the following formula (9).

[Equation 3]

$$Vout = \frac{-Va\Delta Ca1}{Cf} \quad (9)$$

As can be seen from formula (9), the output voltage Vout of the charge pump circuit 103 becomes a voltage according to a changed amount ΔCa1 of the capacitance value of the variable capacitance element Ca1, and a large dynamic range of detection may be taken, whereby the angular velocity and acceleration can be detected with high precision.

Figure 13:
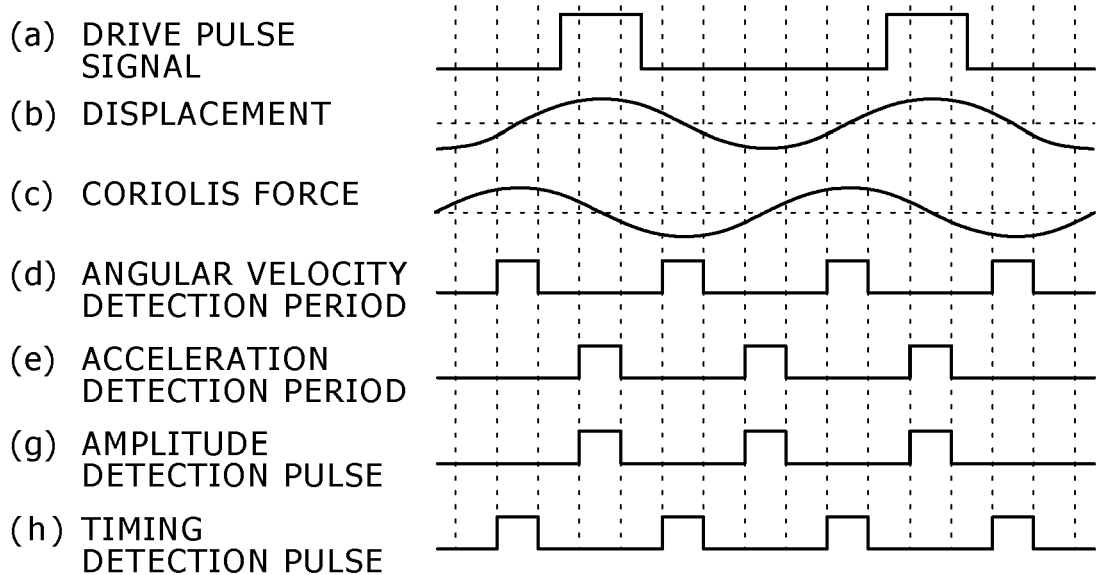
FIG. 13 is a chart for explaining detection timings of an angular velocity and acceleration.

Now, detection timings of the angular velocity and acceleration will be described. FIG. 13 is a chart for explaining the detection timings of the angular velocity and acceleration.

As shown in FIG. 13, the inertia sensor 1 in the embodiment is arranged to detect the angular velocity (FIG. 13(d)) during a time period when Coriolis force (FIG. 13(c)) becomes around the maximum (during predetermined period before and after a time point when Coriolis force becomes the maximum. In other words, period when displacement rate of variable block 12 (FIG. 13(b)) becomes around the maximum), and to detect the acceleration (FIG. 13(e)) during a period when a displacement position of the variable block 12 becomes the maximum (maximum displacement position) from the position of an initial state (within predetermined period before and after displacement rate of variable block 12 becomes the minimum, in other words, within predetermined period before and after a time point when Coriolis force becomes the minimum). The detection pulse signal is arranged to be applied to the structural body 2 during these periods (FIGS. 13(d), 13(e)), by controlling the group of switches 108 by the detection window generator 107. In other words, the above is performed by outputting the amplitude detection pulse (FIG. 13(g)) and the timing detection pulse (FIG. 13(h)) from the detection window generator 107 to the group of switches 108, each switch in the group of switches 108 being operated such that the counter circuit 101 and the buffer circuit 102 is short-circuited (when amplitude detection pulse and timing detection pulse are at High levels, counter circuit 101 and buffer circuit 102 are short-circuited).

The reason of detecting the angular velocity in the period when Coriolis force becomes near the maximum is because the displacement due to the angular velocity becomes the maximum, whereby the angular velocity can be detected with sufficient accuracy and a S/N ratio can be improved. Further, the reason of detecting the acceleration in the period when the displacement position of the variable block 12 becomes near the maximum is because this period is a period when Coriolis force becomes near the minimum, whereby the acceleration can be detected with sufficient accuracy, and the S/N ratio can be improved.

By configuring as this way, it becomes unnecessary to always apply the detection pulse signal to the structural body 2. Further, it becomes unnecessary to perform a process of extracting a signal of the period when Coriolis force becomes the maximum or a signal of the period when the displacement position of the variable block 12 becomes the maximum, out of the signals outputted from the charge pump circuit 103, whereby the processing and the structure may not be complicated.

In the above description, it is arranged that the angular velocity is detected in the period when Coriolis force becomes near the maximum and the acceleration is detected in the period when Coriolis force becomes near the minimum, however, in general, the displacement due to the application of the angular velocity becomes approximately 40-80 dB smaller than the displacement due to the application of the acceleration. Therefore, in such a case, the detection of the angular velocity and the detection of the acceleration may be carried out during the period when Coriolis force becomes near the maximum.

(Second Operation Mode)

Next, the second operation mode will be described with reference to the drawings. FIG. 14 is a chart showing a timing of the detection pulse signal applied to each of the detection electrodes (44, 42a-42d, 43a-43d) of the structural body 2 in the second operation mode.

This second operation mode is an operation mode in which the summing and subtraction (formulae (1)-(6)) are performed at the digital processing unit 109 under the first operation mode by using changed amounts of capacitance value of the respective variable capacitance elements Ca1-Ca8, but by outputting the detection pulse signal from the counter circuit 101 as follows, the summing process and the subtraction process in the digital processing unit 109 are not required.

In other words, among the variable capacitance elements Ca1-Ca8, the detection electrode of the variable capacitance element Ca for summing the capacitance value and the detection electrode of the variable capacitance element Ca for subtracting the capacitance value are applied with the detection pulses signal in positive phase and negative phase having different polarities by shifting the phases. Accordingly, the output according to the angular velocity or acceleration is outputted from the charge pump circuit 103.

For example, as shown in FIG. 14(A), in the case of detecting the acceleration at the X-axis, the detection pulse signal in positive phase is applied to the variable capacitance elements Ca5 and Ca7 during the period when Coriolis force is near the minimum, then the detection pulse signals in negative phase with different polarities are applied to the variable capacitance elements Ca6 and Ca8, whereby a signal of a voltage $\{(Y1-Y2)+(Y3-Y4)\}$ (see formula (4)) according to the acceleration ax at the X-axis can be outputted from the charge pump circuit 103. Unlike the first operation mode, therefore, it is not necessary to calculate $\{(Y1-Y2)+(Y3-Y4)\}$ in the digital processing unit 109, processing load can be reduced, and a circuit structure of the digital processing unit 109 can also be simplified. As shown in FIG. 14(A), a similar process applies to the detection of the acceleration at the Y-axis.

Further, as shown in FIG. 14(A), in the case of detecting the acceleration at the Z-axis, the detection pulse signal in positive phase is applied to the fixed capacitance element Cd, then the detection pulse signals in negative phase with different polarities are applied to the variable capacitance elements Ca1-Ca8, whereby a signal of a voltage $\{X1+X2+X3+X4+Y1+Y2+Y3+Y4\}$ (see formula (6)) according to the acceleration ax at the X-axis can be outputted from the charge pump circuit 103. Thus, in the case where there is only the summation of the capacitance value of the variable capacitance elements Ca1-Ca8 like formula (6) (i.e., in the case where there is no subtraction), detection is realized by applying the detection pulse signal to the fixed capacitance element Cd. It is desirable to arrange at this time such that a total sum of the integration value of the capacitance value of each of the variable capacitance elements Ca1-Ca8 and the voltage amplitude value of the detection pulse signal applied to each of the capacitance value may be set to be equivalent to the integration value of the capacitance value of the fixed capacitance element Cd and the voltage amplitude value of the detection pulse signal applied to this fixed capacitance element Cd. For example, assuming that the capacitance value of each of the variable capacitance elements Ca1-Ca8 and the capacitance value of the fixed capacitance element Cd are equal, and that the voltage amplitude values of the detection pulse signals applied to the respective variable capacitance elements Ca1-Ca8 are equal, it is desirable that the voltage amplitude value of the detection pulse signal applied to the fixed capacitance element Cd is eight times of the voltage amplitude value of the detection pulse signal applied to the variable capacitance elements Ca1-Ca8. The voltage amplitude value of the detection pulse signal is adjusted by the buffer circuit 102 as will be described later, and this buffer circuit 102 changes the voltage amplitude value of the detection pulse signal based on the signal outputted from the digital/analog (D/A) converter 110 to be described later.

Further, as shown in FIG. 14(B), in the case of detecting the angular velocity at the X-axis, the detection pulse signal in positive phase is applied to the variable capacitance elements Ca5 and Ca6 during the period when Coriolis force is near the maximum, then the detection pulse signals in negative phase having different polarities are applied to the variable capacitance elements Ca7 and Ca8, whereby a signal of a voltage $\{(Y1+Y2)-(Y3+Y4)\}$ (see formula (1)) according to the acceleration ax at the X-axis can be outputted from the charge pump circuit 103. Unlike the first operation mode, therefore, it is not necessary to calculate $\{(Y1+Y2)-(Y3+Y4)\}$ in the digital processing unit 109, the processing load can be reduced, and the circuit structure of the digital processing unit 109 can also be simplified. As shown in FIG. 14(B), a similar process applies to the detection of the acceleration at the Y-axis or the Z-axis.

The output of the charge pump circuit 103 is sequentially held in the sample and hold circuit 104 temporarily, and the held voltage is amplified by the amplification circuit 105 and outputted to the analog/digital converter 106. In the analog/digital converter 106, the acceleration at three axes and the angular velocity at three axes are detected based on the output from the amplification circuit 105.

Thus, in the second operation mode, based on formulae (1)-(6) for each axis, the detection pulse signal in phase is applied to the electrode of the variable capacitance element Ca which sums capacitance value, and the detection pulse signal in different phase and negative phase with different polarity is applied to the electrode of the variable capacitance element Ca which subtracts capacitance value from the sum. Further, in the case where there is no electrode of the variable capacitance element Ca which performs subtraction, the detection pulse signal in phase is applied to the fixed electrode, and the detection pulse signal in different phase and negative phase having different polarity is applied to the electrode of the variable capacitance element Ca which performs summation, whereby the detection is carried out by the charge pump circuit 103.

Thus, it is not necessary to perform calculation based on formulae (1)-(6) in the digital processing unit 109, the processing load can be reduced, and the circuit structure of the digital processing unit 109 can also be simplified.

As similar with the first operation mode, it is arranged that the balance of the voltage value is adjusted between the detection pulse signals in positive phase and in negative phase which are outputted from the buffer circuit 102. In other words, it is arranged that the voltage value of the detection pulse signal to be applied is adjusted per each of the detection electrodes 44, 42a-42d, and 43a-43d. Thus, the offset value of the charge pump circuit 103 caused by the capacitance value variations due to the individual differences of the capacitance elements Ca1-Ca8 and Cd in the structural body 2 can be adjusted, and the angular velocity and acceleration can be detected with high precision. In addition, it is desirable to set such that a total sum of the integration value of each capacitance value of the variable capacitance element Ca to which the detection pulse signal in positive phase is applied and the voltage amplitude value of the detection pulse signal to be applied may be equal to a total sum of the integration value of each capacitance value of the variable capacitance element Ca to which the detection pulse signal in negative phase is applied and the voltage amplitude value of the detection pulse signal in negative phase to be applied.

Figure 15:
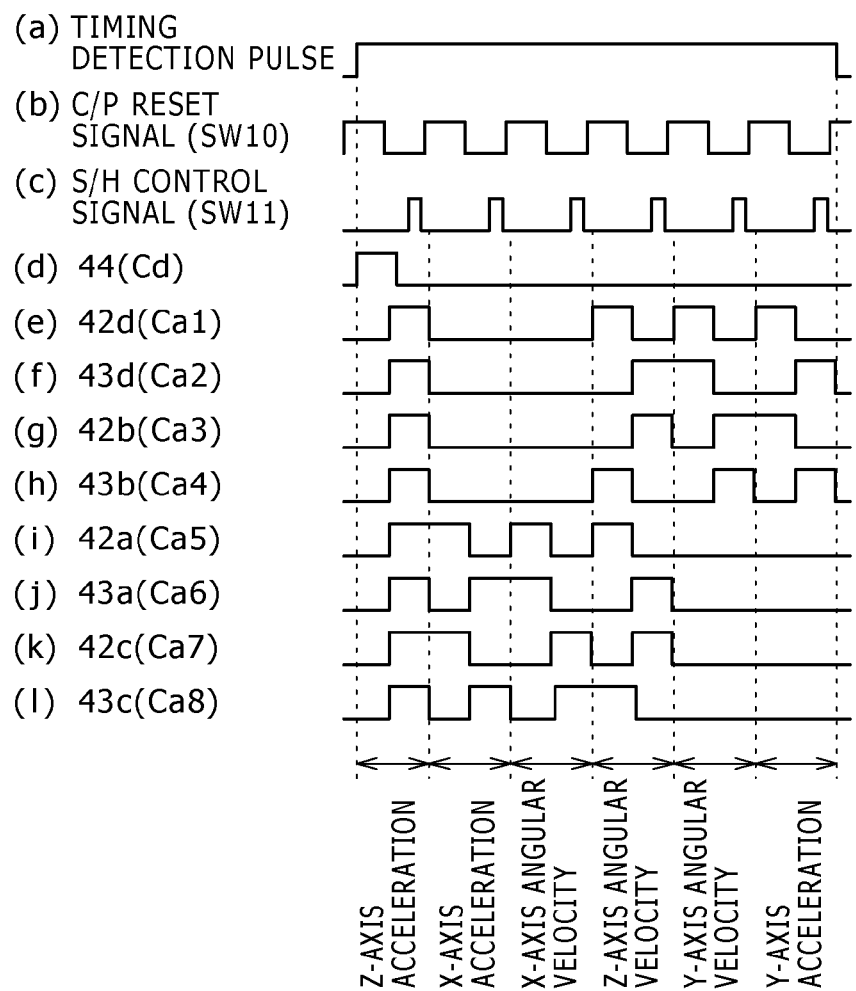
FIG. 15 is another chart showing a timing of the detection pulse signal applied to each detection electrode of the structural body under the second operation mode.

Further, as describe above, the detection of the angular velocity is performed during the period when Coriolis force is near the maximum, and instead of arranging that the detection of the acceleration is performed during the period when Coriolis force is near the minimum, as shown in FIG. 15, it may be arranged that the detection of the angular velocity and the detection of the acceleration are performed during the period when Coriolis force is near the maximum. FIG. 15 is another chart showing other timings of the detection pulse signal applied to the respective detection electrodes (44, 42a-42d, 43a-43d) of the structural body 2 in the second operation mode.

(Structure of Drive Control Unit 61)

Next, a structure of the drive control unit 61 will be particularly described with reference to FIG. 9. As shown in FIG. 9, the drive control unit 61 is provided with a charge pump (C/P) circuit 120, a sample and hold (S/H) circuit 121, a peak detector 122, a timing detector 123, an automatic gain control (AGC) circuit 124, and a driver circuit 125. These circuits function as a drive circuit and are controlled as follows such that a displacement width of the reciprocal vibrations of the variable blocks 12a and 12b may be constant. Noted, a displacement detection unit is constituted by the charge pump (C/P) circuit 120, the sample and hold (S/H) circuit 121, the peak detector 122, the timing detector 123, etc.

In other words, in the charge pump circuit 120, a difference between the capacitance values of the variable capacitance elements Cf1 and Cf2 whose capacitance values change based on the displacement positions of the variable blocks 12a and 12b is detected (this charge pump circuit 120 is a circuit which performs operation similar to that of the charge pump circuit 103, and detects the difference between the capacitance values of the two capacitance elements). The sample and hold circuit 121 samples and holds this output from the charge pump circuit 120 sequentially at a timing synchronized with the detection pulse signal, and the output subjected to sample and hold is outputted to the peak detector 122 and the timing detector 123.

In the peak detector 122, the maximum value of the signal outputted from the sample and hold circuit 121 is detected and outputted. The timing detector 123 detects a zero-cross point (point in which displacements of variable blocks 12a and 12b become in initial state and Coriolis force becomes the maximum) of the signal outputted from the sample and hold circuit 121, and outputs a timing detection signal which has a rising or falling change point in a predetermined period before and after the detection timing. Noted, the timing detector 123 is constituted by a comparator or the like which uses a reference voltage Vref as a threshold.

Based on the output from the peak detector 122, the automatic gain control (AGC) circuit 124 supplies the driver circuit 125 with a signal making adjustment such that the displacement width of the reciprocal vibrations of the variable blocks 12a and 12b is kept constant. Based on the timing detection pulse outputted from the timing detector 123, the driver circuit 125 supplies the drive electrodes 13a-13d with the drive pulse signal obtained by electric amplification of the signal from the automatic gain control circuit 124 during a predetermined period before and after the time when the displacement of the variable blocks 12a-12d becomes the maximum. In addition, the driver circuit 125 outputs the drive pulse signals whose phases are inverted mutually to the drive electrodes 13a and 13c and the drive electrodes 13b and 13d respectively, to cause the drive electrodes 13a and 13c and the drive electrodes 13b and 13d to vibrate in anti-phase. Further, it is assumed that a frequency of this vibration is within a range of 2 k-10 kHz, for example.

As described above, the signal according to a displacement state of the variable blocks 12a and 12b is applied to the drive electrodes 13a-13d, and self-excited vibration is caused in each of the variable blocks 12a-12d.

In addition, the drive control unit 61 is further provided with the PLL circuit 129, a monitor detection window generator 126, a group of switches 127, and a buffer circuit 128, as shown in FIG. 9.

Figure 16:
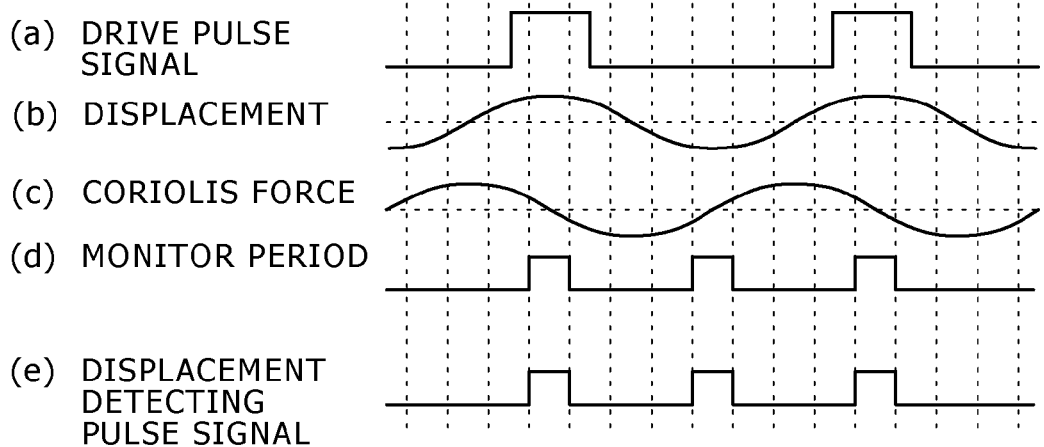
FIG. 16 is a chart for explaining a timing of a displacement detecting pulse signal applied to a drive monitor electrode of the structural body.

Based on the timing detection signal outputted from the timing detector 123, the PLL circuit 129 generates the clock signal CLK obtained by multiplying the timing detection signal synchronized with the vibration of each of the variable blocks 12a-12d, outputs the clock signal CLK, and outputs the timing detection signal. Based on the clock signal CLK and the timing detection signal which are inputted from the PLL circuit 129, the monitor detection window generator 126 outputs the displacement detecting pulse signal (see FIG. 16(e)) which becomes active (here High level) during the period when Coriolis force is near the maximum (see FIG. 16(d)). Here, FIG. 16 is a chart for explaining a timing of the displacement detecting pulse signal to be applied to the drive monitor electrodes 52a and 52b of the structural body 2.

The group of switches 127 are for selecting either the detection pulse signal or the reference voltage Vref outputted from the counter circuit 101, and outputting the selected one to the drive monitor electrodes 52a and 52b, and are controlled by the displacement detecting pulse signal outputted from the monitor detection window generator 126. The displacement detecting pulse signal is outputted from the counter circuit 101 only in a period when this displacement detecting pulse signal is active (here High level) (see FIG. 16(e)). The thus outputted displacement detecting pulse signals are amplified in the buffer circuit 128 respectively, and applied to the drive monitor electrodes 52a and 52b.

As described above, it is arranged that the displacement detection of each of the variable blocks 12a-12d is carried out by applying the displacement detecting pulse signal to the drive monitor electrodes 52a and 52b in the vicinity of a position where the displacement of each of the variable blocks 12a-12d is the maximum. Accordingly, the displacement of the variable blocks 12a-12d can be detected with sufficient accuracy. The displacement-detecting pulse signal applying unit is constituted by the monitor detection window generator 126, the group of switches 127, and the buffer circuit 128.

As described above, the inertia sensor 1 in the embodiment, the window is limited to apply the detection pulse signal to the capacitance elements Ca1-Ca8 and Cd. However, the synchronous detection circuit synchronized with the drive signal which has been used may concurrently be used, without performing such window control, so that the detection pulse signal may be continuously applied.

In other words, in the above description, it is arranged that the detection pulse signal is applied to the structural body 2 by the detection window generator 107 only for a predetermined period (period when Coriolis force is near the maximum, and period when Coriolis force is near the minimum). However, for example, at a timing as shown in FIG. 17, without performing such window control, the detection pulse signal may be continuously applied to the capacitance elements Ca1-Ca8 and Cd. FIG. 17 is a chart showing other timing of the detection pulse signal applied to each of the detection electrodes (44, 42a-42d, 43a-43d) of the structural body 2. The frequency of the detection pulse signal is operated at a frequency of approximately 16-128 times of the frequency of the drive pulse signal outputted from the driver circuit 125, for example. Further, as for the detection of the acceleration at the Z-axis, calculation of $\{\Delta X1+\Delta X4+\Delta Y2+\Delta Y3\}$ is used, however, for example, {ΔX1+ΔX2+ΔX3+ΔX4+ΔY1+ΔY2+ΔY3+ΔY4} may be used as described above.

Figure 18A:
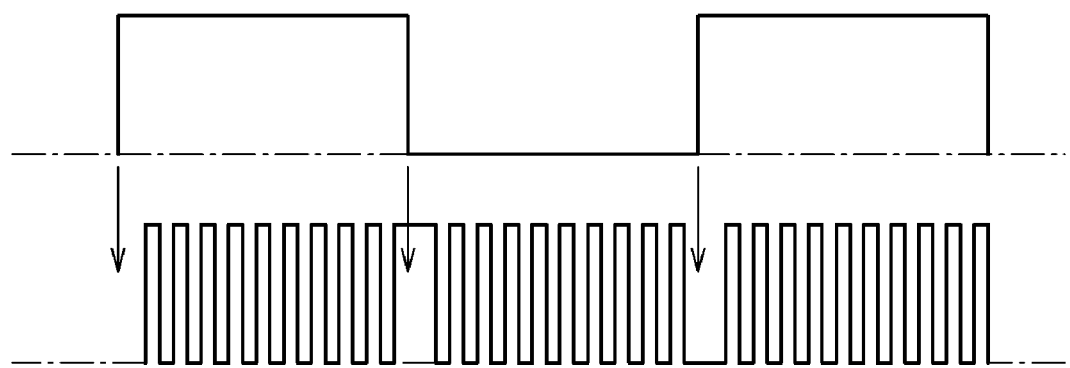
FIG. 18 is a chart for explaining a phase relationship between a drive pulse signal and the detection pulse signal.
Figure 18B:
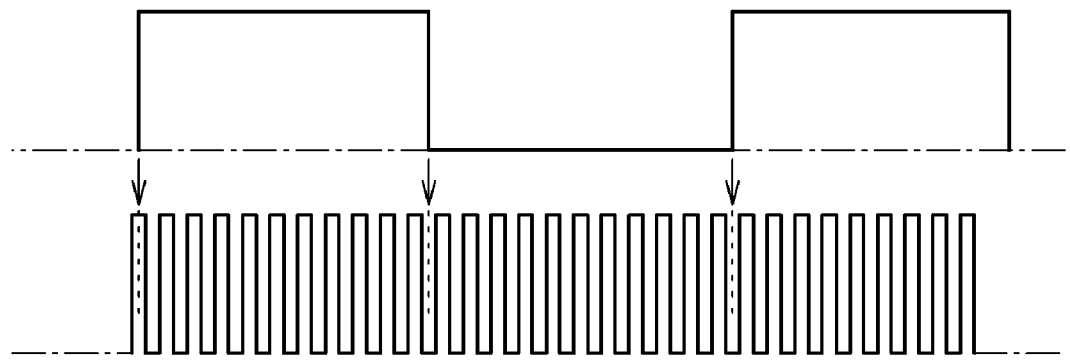

Next, a phase relationship between the drive pulse signal outputted from the driver circuit 125 and the detection pulse signal applied to the structural body 2 is described. FIG. 18 is a chart for explaining the phase relationship between the drive pulse signal and the detection pulse signal in the embodiment.

As described above, when the detection pulse signal which is at a rising edge or a falling edge is outputted at a timing at a rising edge or a falling edge of the drive pulse signal, there is a possibility that the high frequency components at a rising or falling edge portion of the drive pulse signal may affect the circuit in the detection control unit 60 etc., as the noises through parasitic capacitance.

Then, in the detection control unit 60 in the embodiment, as shown in FIG. 18(*a*), near the rising edge or near the falling edge of the drive pulse signal, the counter circuit 101 does not output but masks the detection pulse signal by the amount corresponding to a predetermined period (for example, by one period or two periods). Accordingly, the influence of the noises to the circuit in the detection control unit 60 etc. due to the edge portion of the drive pulse signal may be suppressed.

Further, in order that the detection pulse signal may not be at the rising edge or the falling edge when the drive pulse signal is at the rising edge or the falling edge, the detection control unit 60 is provided with the phase shift circuit for shifting the phase of the drive pulse signal or the detection pulse signal. Accordingly, simultaneous generation of rising edges or falling edges of the drive pulse signal and the detection pulse signal may be prevented as shown in FIG. 18(*b*), and the effects similar to those shown in the above (FIG. 18(*a*)) maybe obtained. Further, since the detection pulse signal is not masked, the number of times of detecting the capacitance value of the capacitance element is not decreased. For example, in the detection control unit 60, the phase shift circuit for the clock signaling CLK is provided at the preceding stage of the phase shifter 100, the clock signal CLK shifted in phase by this phase shift circuit is inputted into the phase shifter 100, so that the rising edges or falling edges of the drive pulse signal and the detection pulse signal are prevented from occurring at the same time. In addition, since the drive pulse signal and the detection pulse signal are synchronized with each other, the phase relationship between the drive pulse signal and the detection pulse signal becomes constant.

As described above, the inertia sensor 1 in the embodiment, has the structural body provided with the plurality of variable blocks where the variable capacitance element is formed whose capacitance value changes in accordance with the applied inertial force and the fixed block where the fixed capacitance element is formed whose capacitance value is fixed, in which variable block may be reciprocally vibrated in the predetermined direction, and the detector circuit for detecting the value of the applied inertial force based on the capacitance values of the capacitance elements formed in this structural body, thus allowing detection of the angular velocity at three axes and the acceleration at three axes.

Further, by driving the variable block 12 in anti-phase, acceleration disturbance is canceled and the angular velocity can be detected with high precision. Furthermore, in an anti-phase mode, unnecessary disturbance displacement, such as centrifugal force, is not entered in the detection displacement, the large dynamic range of detection may be provided, and the inertia sensor which can detect the angular velocity and the acceleration with highly precision may be realized. Noted, this inertia sensor 1 maybe applied to mechanical control for a robot, an input interface, hand shake compensation in a video camera or a still camera, fall prevention means, and the like.

In the above, several embodiments of the present invention are described in detail with reference to the drawings, but these are exemplification and the present invention may be implemented in other embodiments in which various modifications and improvement are made based on the knowledge of the person skilled in the art.

For example, in the above-described embodiments, two types of operation modes, the first operation mode and the second operation mode, may be chosen. However, it may be naturally arranged that either one operation is selected.

Further, in the above-described embodiments, although the capacitance elements Ca1-Ca8 and Cd are connected to one charge pump circuit, they may be connected with a plurality of charge pump circuits separately. In this case, the corresponding number of sample and hold circuits and amplification circuits are provided according to the charge pump circuits.

Further, although the detection window generator and the group of switches are provided to control the window, when continuing and outputting the detection pulse signal as shown in FIG. 17, the variable block may switch between inverse amplification and non-inverse amplification of the output from the sample and hold circuit in the amplification circuit (switch is provided between amplification circuit and sample and hold circuit to switch) according to the direction of the displacement position with respect to the initial state, and the digital processing unit may detect the angular velocity based on the signal of the period when Coriolis force is near the maximum, and may detect the acceleration based on the signal of the period when Coriolis force is near the minimum.

It should be understood by those skilled in the art that various modifications, combinations, sub-combinations and alterations may occur depending on design requirements and other factors insofar as they are within the scope of the appended claims or the equivalents thereof.

What is claimed is:

1. A detector device, comprising:
   a fixed block with a fixed capacitance element with a fixed capacitance value;
   a plurality of variable blocks positioned about the fixed bock, each variable block having a variable capacitance element with a capacitance value that changes in accordance with applied inertial force, the variable blocks reciprocally displacing relative to the fixed block in respective predetermined directions to detect a value of the applied inertial force based on the capacitance value of the respective variable capacitance element, one side of the fixed capacitance element and one side of each of the variable capacitance elements electrically coupled together;
   a drive circuit for outputting a drive pulse signal for displacing the variable blocks;
   a detection pulse signal applying unit by which applies detection pulse signals to the other sides of the variable capacitance elements and the fixed capacitance element which are not coupled together, the detection pulse signals having a plurality of phases, each phase having a predetermined phase difference at a timing synchronized with the drive pulse signals; and
   an inertia detection unit which detects a difference in capacitance (a) between the variable capacitance elements to which the detection pulse signals having the phase differences are applied, or (b) between the fixed capacitance element and the variable capacitance elements, and detecting the applied inertial force based on the difference in capacitance value, wherein, each variable block includes a movable body suspended therein by means of flexible support beams allowing displacement of the movable body upon application of the applied inertial force.

2. The detector device according to claim 1, wherein:
the detection pulse signal applying unit (a) sequentially applies detection pulse signals having different polarities to the fixed capacitance element and two or more of the variable capacitance elements respectively, and (b) sequentially applies detection pulse signals having different polarities to two or more of the variable capacitance elements and another two or more of the variable capacitance elements respectively, and the inertia detection unit performs summation and subtraction of capacitance values of the plurality of variable capacitance elements by means of the detection pulse signal, and respectively outputs signals according to an angular velocity at each detection axis and acceleration at each detection axis among the applied inertial forces.

3. The detector device according to claim 1, wherein:
the detection pulse signal applying unit sequentially applies detection pulse signals having different polarities to the fixed capacitance element and the variable capacitance elements respectively, and
the inertia detection unit detects a change in capacitance value of each of the variable capacitance elements by the detection pulse signal.

4. The detector device according to claim 1, wherein the detection pulse signal applying unit switches a voltage amplitude of a respective detection pulse signal according to the capacitance element to which the respective detection pulse signal is applied.

5. The detector device according to claim 1, wherein, for detecting angular velocity, the detection pulse signal applying unit applies the detection pulse signals to the capacitance element during a predetermined time period before and after when a displacement rate of the variable blocks becomes a maximum, and, for detecting acceleration, applies the detection pulse signals to the capacitance element during a predetermined time period before and after when the displacement rate of the variable blocks becomes a minimum.

6. The detector device according to claim 1, wherein the detection pulse signal applying unit applies the detection pulse signals to the capacitance elements during a predetermined time period before and after when a displacement rate of the variable blocks becomes a maximum.

7. The detector device according to claim 1, comprising:
for each variable block, a displacement-detecting variable capacitance element constituted by the variable block and a fixed electrode facing this variable block;
for each variable block, a displacement-detecting pulse signal applying unit for applying a displacement detecting pulse signal to the displacement-detecting variable capacitance element; and
a displacement detection unit for detecting a displacement state of each variable block from the capacitance value of the displacement-detecting variable capacitance element, the capacitance value being detected by the displacement detecting pulse signal applied by the displacement-detecting pulse signal applying unit, wherein, for each variable block, the displacement-detecting pulse signal applying unit applies the displacement detecting pulse signal to the displacement-detecting variable capacitance element during a predetermined period before and after when the displacement of the variable block becomes a maximum.

8. The detector device according to claim 1, wherein the detection pulse signal applying unit does not apply a detection pulse signal to the capacitance element at a time of a rising edge or a falling edge of the drive pulse signal.

9. The detector device according to claim 1, wherein the detection pulse signal applying unit is provided with a shift circuit for shifting a phase of a respective detection pulse signal or a respective drive pulse signal so that the respective detection pulse signal may not be at the rising edge or the falling edge during the rising edge or the falling edge of the respective drive pulse signal.

10. An inertia sensor, comprising:
a structural body with (a) a plurality of variable blocks, each with a variable capacitance element whose capacitance value changes in accordance with applied inertial force and (b) a fixed block with a fixed capacitance element whose capacitance value is fixed, one side of the fixed capacitance element and one side of each of the variable capacitance elements being electrically coupled together, each variable block reciprocally displacing relative to the fixed block in a predetermined direction, each variable block including a movable body suspended therein by support beams allowing the movable body to vibrate; and
a detector device for detecting a value of the applied inertial force based on the capacitance value of the capacitance elements of the structural body, wherein, the detector device includes (a) a drive circuit which outputs a drive pulse signal which displaces the variable block (b) a detection pulse signal applying unit which applies respective detection pulse signals with a plurality of phases each having a predetermined phase difference at a timing synchronized with the drive pulse signal and (c) an inertia detection unit which detects a difference in capacitance value between the variable capacitance elements to which the detection pulse signals having the phase difference are applied, or between the fixed capacitance element and the variable capacitance elements, and detecting the applied inertial force based on the difference.

* * * * *